United States Patent
Ino et al.

(10) Patent No.: US 10,510,862 B2
(45) Date of Patent: Dec. 17, 2019

(54) SEMICONDUCTOR MEMORY DEVICE

(71) Applicant: Toshiba Memory Corporation, Minato-ku (JP)

(72) Inventors: Tsunehiro Ino, Fujisawa (JP); Yusuke Higashi, Zushi (JP); Toshinori Numata, Kamakura (JP); Yuuichi Kamimuta, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/134,314

(22) Filed: Sep. 18, 2018

(65) Prior Publication Data

US 2019/0296122 A1    Sep. 26, 2019

(30) Foreign Application Priority Data

Mar. 23, 2018 (JP) ................. 2018-055401

(51) Int. Cl.
*H01L 29/51* (2006.01)
*H01L 27/1159* (2017.01)
(Continued)

(52) U.S. Cl.
CPC ........ *H01L 29/516* (2013.01); *H01L 27/1159* (2013.01); *H01L 27/11597* (2013.01);
(Continued)

(58) Field of Classification Search
CPC ............. H01L 21/28291; H01L 29/516; H01L 29/6684; H01L 29/78391;
(Continued)

(56) References Cited

U.S. PATENT DOCUMENTS

| 6,344,991 B1 | 2/2002 | Mikami et al. |
| 6,714,435 B1 | 3/2004 | Dimmler et al. |
| (Continued) | | |

FOREIGN PATENT DOCUMENTS

| JP | 6-76562 | 3/1994 |
| JP | 7-86528 | 3/1995 |
| (Continued) | | |

*Primary Examiner* — Laura M Menz
*Assistant Examiner* — Candice Chan
(74) *Attorney, Agent, or Firm* — Oblon, McClelland, Maier & Neustadt, L.L.P.

(57) ABSTRACT

A semiconductor memory device of an embodiment includes a semiconductor layer; a gate electrode including a first portion, a second portion provided to be spaced apart from the first portion, and a spacer provided between the first portion and the second portion; and a first insulating layer provided between the semiconductor layer and the gate electrode and including a first region containing a ferroelectric, a ferrielectric, or an anti-ferroelectric, a second region containing a ferroelectric, a ferrielectric, or an anti-ferroelectric, and a boundary region provided between the first region and the second region. The first region is positioned between the first portion and the semiconductor layer, the second region is positioned between the second portion and the semiconductor layer, the boundary region is positioned between the spacer and the semiconductor layer, and the boundary region has a chemical composition different from that of the spacer.

7 Claims, 15 Drawing Sheets

(51) Int. Cl.
*H01L 27/11597* (2017.01)
*H01L 29/78* (2006.01)
*H01L 29/49* (2006.01)
*H01L 27/11587* (2017.01)

(52) U.S. Cl.
CPC ........ *H01L 29/4983* (2013.01); *H01L 29/512* (2013.01); *H01L 29/513* (2013.01); *H01L 29/517* (2013.01); *H01L 29/78391* (2014.09); *H01L 27/11587* (2013.01)

(58) Field of Classification Search
CPC ....... H01L 27/11585–27/11597; H01L 29/513; H01L 29/4983; G11C 11/223
See application file for complete search history.

(56) References Cited

U.S. PATENT DOCUMENTS

| | | |
|---|---|---|
| 7,465,980 B2 | 12/2008 | Arimoto et al. |
| 9,053,802 B2 | 6/2015 | Muller et al. |
| 9,830,969 B2 | 11/2017 | Slesazeck et al. |
| 9,954,167 B2 | 4/2018 | Fujii et al. |
| 2006/0081901 A1 | 4/2006 | Arimoto et al. |
| 2017/0005261 A1 | 1/2017 | Fujii et al. |

FOREIGN PATENT DOCUMENTS

| | | |
|---|---|---|
| JP | 7-335771 | 12/1995 |
| JP | 8-264721 | 10/1996 |
| JP | 11-3976 | 1/1999 |
| JP | 11-220105 | 8/1999 |
| JP | 2001-24074 | 1/2001 |
| JP | 2001-267515 | 9/2001 |
| JP | 2002-43538 | 2/2002 |
| JP | 2004-311512 | 11/2004 |
| JP | 2005-216951 | 8/2005 |
| JP | 2006-108648 | 4/2006 |
| JP | 2011-9549 | 1/2011 |
| JP | 2016-58517 | 4/2016 |
| WO | WO 95/26570 | 10/1995 |

SEMICONDUCTOR MEMORY DEVICE

CROSS-REFERENCE TO RELATED APPLICATION

This application is based upon and claims the benefit of priority from Japanese Patent Application No. 2018-055401, filed on Mar. 23, 2018, the entire contents of which are incorporated herein by reference.

FIELD

Embodiments described herein relate generally to a semiconductor memory device.

BACKGROUND

Ferroelectric memories have attracted attention as nonvolatile memories. In particular, it is expected to apply a one-transistor memory cell having a Metal Ferroelectrics Semiconductor (MFS) structure to, for example, a NAND flash memory.

In order to increase the memory capacity of the NAND flash memory, a multi-value operation of a memory cell has been progressed. It is desired to realize the multi-value operation even for the memory cell having the MFS structure.

DETAILED DESCRIPTION

Figure 1:
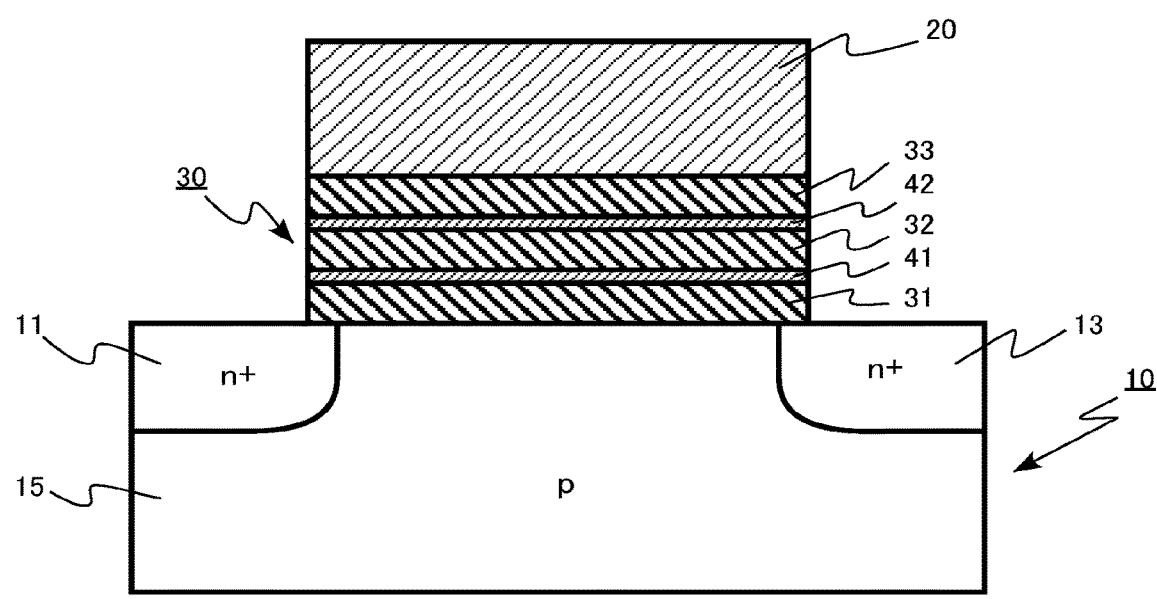
FIG. 1 is a schematic cross-sectional view of a semiconductor memory device according to a first embodiment.

A semiconductor memory device according to an embodiment includes a semiconductor layer; a gate electrode including a first portion, a second portion provided to be spaced apart from the first portion in a direction along a surface of the semiconductor layer, and a spacer provided between the first portion and the second portion; and a first insulating layer provided between the semiconductor layer and the gate electrode, the first insulating layer including a first region containing at least one of a ferroelectric, a ferrielectric, or an anti-ferroelectric, a second region containing at least one of a ferroelectric, a ferrielectric, or an anti-ferroelectric, and a boundary region provided between the first region and the second region, wherein the first region is positioned between the first portion and the first semiconductor layer, the second region is positioned between the second portion and the semiconductor layer, the boundary region is positioned between the spacer and the semiconductor layer, and the boundary region has a chemical composition different from that of the spacer.

Hereinafter, embodiments of the present disclosure will be described with reference to the drawings. In the following description, the same or similar members and the like will be denoted by the same reference numerals, and members that have been once described will not be described as appropriate.

In the present specification, the term "above" or "below" will be sometimes used for the sake of convenience. The term "above" or "below" is merely a term indicating a relative positional relationship within a drawing and is not a term that defines a positional relationship with respect to gravity.

Qualitative analysis and quantitative analysis of chemical compositions of members constituting a semiconductor device in this specification can be carried out by secondary ion mass spectroscopy (SIMS) and energy dispersive X-ray spectroscopy (EDX). In addition, a transmission electron microscope (TEM) and spherical aberration corrected Scanning Transmission Electron Microscope (Cs-corrected STEM), for example, can be used for measurement of each thickness of the members constituting the semiconductor device, a distance between the members, and the like. In addition, not only the above TEM but also convergent-beam electron diffraction (CBED), an X-ray diffraction method using free electron lasers such as radiation beams and a spring-8 angstrom compact free electron laser (SACLA), Fourier transform infrared spectroscopy (FT-IR), or an X-ray photoelectron spectroscopy (XPS) can be used for identification of the crystal system of the members constituting the semiconductor memory device.

First Embodiment

A semiconductor memory device according to a first embodiment includes a semiconductor layer; a gate electrode; and a first insulating layer including a first region provided between the semiconductor layer and the gate electrode and containing at least one of a ferroelectric, a ferrielectric, or an anti-ferroelectric, a second region containing at least one of a ferroelectric, a ferrielectric, or an anti-ferroelectric, and a boundary region provided in at least a part between the first region and the second region and having at least any of a chemical composition or a crystal structure different from that of both the first region and the second region. Further, the second region is provided between the first region and the gate electrode, and the first region and the second region are divided with the boundary region.

FIG. 1 is a schematic cross-sectional view of the semiconductor memory device according to the first embodiment. The semiconductor memory device of the first embodiment is a memory cell having an MFS structure.

The memory cell of the first embodiment includes a semiconductor layer 10, a source region 11, a drain region 13, a channel region 15, a gate electrode 20, and a gate insulating layer 30 (a first insulating layer). The gate insulating layer 30 includes a first ferroelectric region (a first region), a second ferroelectric region 32 (a second region), a third ferroelectric region 33, a first boundary insulating layer 41 (a boundary region), and a second boundary insulating layer 42.

The semiconductor layer 10 is, for example, single crystal silicon.

The source region 11 is provided in the semiconductor layer 10. The source region 11 is an n-type impurity region. The drain region 13 is provided in the semiconductor layer 10. The drain region 13 is an n-type impurity region. The channel region 15 is provided in the semiconductor layer 10. The channel region 15 is a p-type impurity region.

The gate electrode 20 is metal or a semiconductor. The gate electrode 20 is, for example, polycrystalline silicon containing n-type impurities or p-type impurities.

The gate insulating layer 30 includes the first ferroelectric region 31, the second ferroelectric region 32, the third ferroelectric region 33, the first boundary insulating layer 41, and the second boundary insulating layer 42.

Each of the first ferroelectric region 31, the second ferroelectric region 32, and the third ferroelectric region 33 contains at least one of the ferroelectric, the ferrielectric, or the anti-ferroelectric. Each of the first ferroelectric region 31, the second ferroelectric region 32, and the third ferroelectric region 33 contains, for example, hafnium oxide, lead zirconate titanate (PZT), strontium bismuth tantalate (SBT), barium titanate (BTO), or polyvinylidene fluoride (PVDF).

For example, the first ferroelectric region 31, the second ferroelectric region 32, and the third ferroelectric region 33 can have the same coercive electric field, for example. The coercive electric field of each layer herein means an absolute value of an electric field in which the polarization is reversed with respect to an electric field substantially applied to each layer (the same applies hereinafter). In addition, the first ferroelectric region 31, the second ferroelectric region 32, and the third ferroelectric region 33 may have the same crystal orientation, for example.

The first ferroelectric region 31 is an example of the first region. In addition, the second ferroelectric region 32 is an example of the second region.

For example, each of the first boundary insulating layer 41 and the second boundary insulating layer 42 has a chemical composition different from that of the first ferroelectric region 31, the second ferroelectric region 32, and the third ferroelectric region 33. Each of the first boundary insulating layer 41 and the second boundary insulating layer 42 is, for example, a paraelectric body. Each of the first boundary insulating layer 41 and the second boundary insulating layer 42 is, for example, a material containing 50% or more of silicon nitride, aluminum nitride, aluminum oxide, or silicon oxide. The word "chemical composition" means kinds or combination of element included in the layers or atomic ratio of the elements included in the layers.

Each film thicknesses of the first boundary insulating layer 41 and the second boundary insulating layer 42 is, for example, 0.1 nm or more and 2.5 nm or less.

The first boundary insulating layer 41 is an example of the boundary region.

The second ferroelectric region 32 is provided between the first ferroelectric region 31 and the gate electrode 20. The first ferroelectric region 31 and the second ferroelectric region 32 are divided vertically by the first boundary insulating layer 41. Similarly, the second ferroelectric region 32 and the third ferroelectric region 33 are divided vertically by the second boundary insulating layer 42. The division by the first boundary insulation between the first ferroelectric region and the second ferroelectric region is not necessary perfect screening of long range force such like Coulomb force but sufficient only weaken these forces.

In the memory cell of the first embodiment, a polarization reversal state of the ferroelectric contained in the gate insulating layer 30 is controlled by a voltage to be applied between the gate electrode 20 and the semiconductor layer 10. A threshold voltage of a transistor of the memory cell changes depending on the polarization reversal state of the gate insulating layer 30. An on-current of the transistor of the memory cell changes as the threshold voltage of the transistor of the memory cell changes. For example, when a state where the threshold voltage is high and the on-current is low is defined as data "0", and a state where the threshold voltage is low and the on-current is high is defined as data "1", the memory cell can store a 1-bit data of "0" and "1".

For example, a NAND string of a NAND flash memory can be formed by connecting the transistors of the memory cell illustrated in FIG. 1 in series.

Incidentally, when manufacturing the transistor of the memory cell of FIG. 1, a film for formation of the first ferroelectric region 31, the first boundary insulating layer 41, a film for formation of the second ferroelectric region 32, and the second boundary insulating layer 42 are deposited on the semiconductor layer 10. Further, the transistor can be manufactured by performing crystallization annealing, for example, at a temperature between 600° C. and 1000° C. after forming the gate electrode 20. Crystals of the ferroelectric are formed by the crystallization annealing.

Next, a function and an effect of the semiconductor memory device of the first embodiment will be described.

Ferroelectric memories have attracted attention as non-volatile memories. It is expected to apply a one-transistor memory cell having an MFS structure as illustrated in FIG. 1 to, for example, the NAND flash memory. In order to increase the memory capacity of the NAND flash memory, a multi-value operation of the memory cell has been progressed. It is desired to realize the multi-value operation even for the memory cell having the MFS structure.

When multiple values are written in the ferroelectric memory, it is necessary to control a position of a domain wall in a ferroelectric film. The domain wall is a boundary that separates polarization domains with different polarization directions. A proportion of the polarization domain in which a polarization vector is oriented in a predetermined direction is changed by an external electric field applied to the ferroelectric film. As the position of the domain wall is changed by the external electric field applied to the ferroelectric film, the proportion of the polarization domain in which the polarization vector is oriented in a predetermined direction changes. By controlling the proportion of the polarization domain oriented in the predetermined direction, multiple values can be stored in the memory cells.

The size of the ferroelectric film becomes smaller along with scaling-down of the ferroelectric memory. For this reason, it is difficult to control to stop the domain wall at a desired position.

Figure 2:
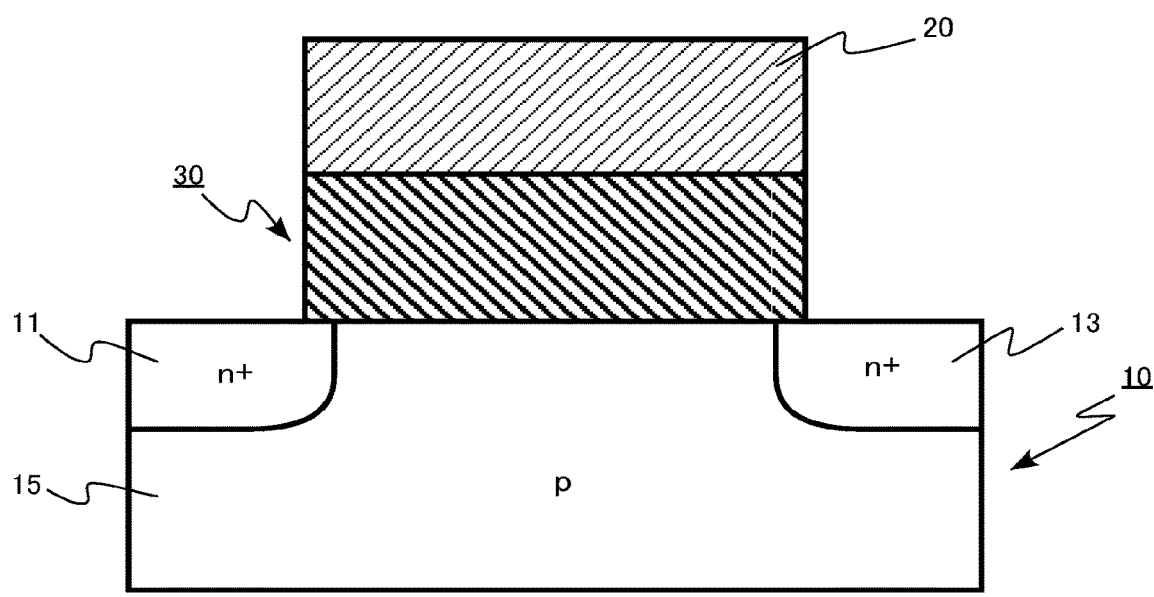
FIG. 2 is a schematic cross-sectional view of a semiconductor memory device according to a comparative example.

FIG. 2 is a schematic cross-sectional view of a semiconductor memory device according to a comparative example. A memory cell of the comparative example is different from that of the first embodiment in terms that the gate insulating layer 30 is not divided by the first boundary insulating layer 41 and the second boundary insulating layer 42. The gate insulating layer 30 contains a ferroelectric.

Figure 3A:
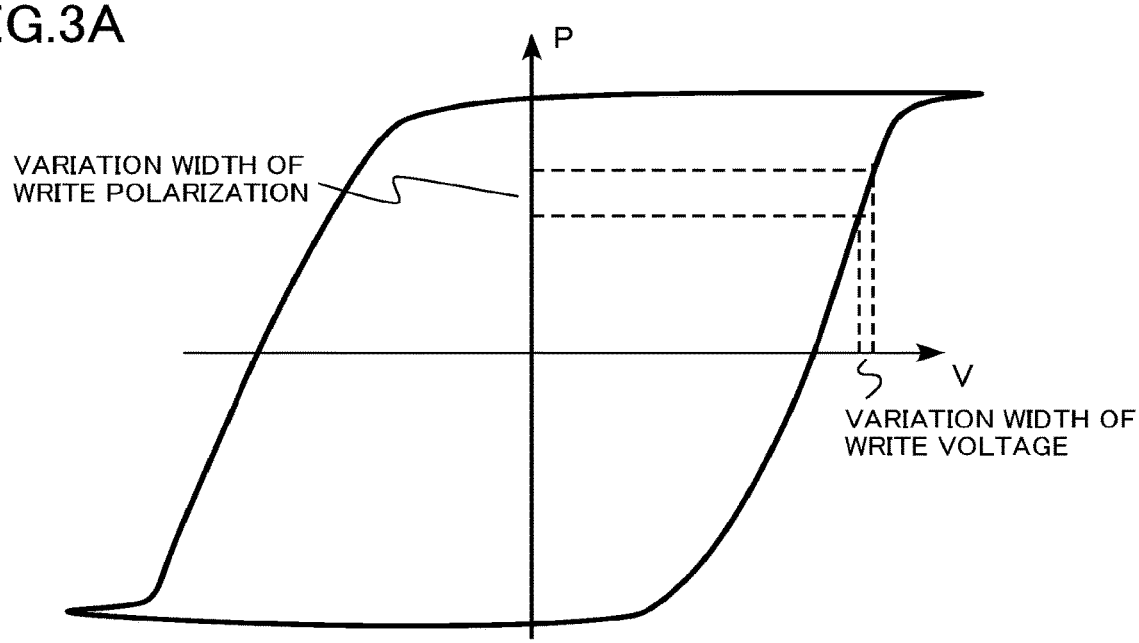
FIGS. 3A and 3B are graphs for describing a function and an effect of the semiconductor memory device according to the first embodiment.
Figure 3B:
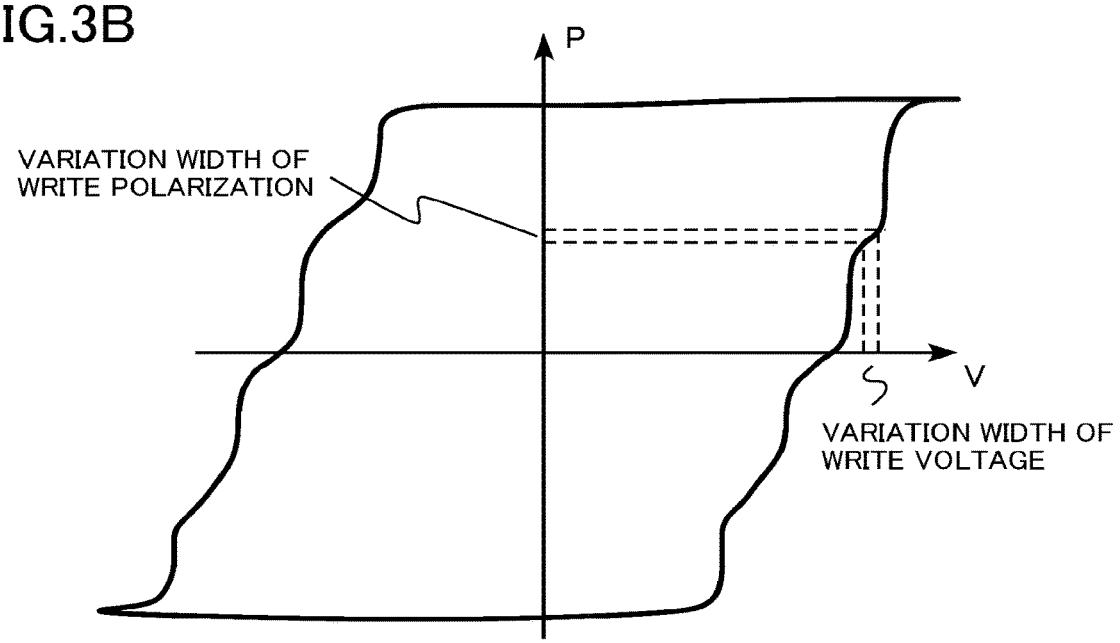

FIGS. 3A and 3B are graphs for describing the function and the effect of the semiconductor memory device according to the first embodiment. FIG. 3A illustrates a polarization-voltage characteristic (P-V characteristic) of the memory cell of the comparative example. FIG. 3B illustrates a polarization-voltage characteristic (P-V characteristic) of the memory cell of the first embodiment.

As illustrated in FIGS. 3A and 3B, it is understood that the P-V characteristic of the memory cell of the first embodiment changes in a stepwise manner. Thus, a variation width of a write polarization with respect to a variation width of a write voltage is smaller than that in the comparative example. Therefore, the stable multi-value write control becomes possible as compared with the comparative example.

It is considered that the reason why the P-V characteristic of the memory cell of the first embodiment changes in a stepwise manner is that the gate insulating layer 30 is divided into the three regions of the first ferroelectric region 31, the second ferroelectric region 32, and the third ferroelectric region 33. Since the first boundary insulating layer 41 and the second boundary insulating layer 42 are present at each boundary between the regions, it is considered that the movement of the domain wall stops. It is considered that the stepwise change in P-V characteristic appears due to this stop and re-movement of the domain wall that starts with the polarization reversal nucleus newly generated in another ferroelectric region as a starting point.

According to the memory cell of the first embodiment, the stepwise P-V characteristic can be obtained due to the division of the ferroelectric region, and thus, it is possible to accurately write polarization values corresponding to desired multiple values. Therefore, it is possible to realize a fine multi-value ferroelectric memory having a gate length of 25 nm or less, for example.

In the case of the memory cell of the first embodiment, the ferroelectric region is divided into three regions, and thus, it is possible to store four values while accurately controlling levels of the respective values.

Each film thickness of the first boundary insulating layer 41 and the second boundary insulating layer 42 is preferably 0.1 nm or more and 2.5 nm or less. When the film thickness falls below the above range, there is a risk that it may be difficult to obtain the effect of stopping the movement of the domain wall. When the film thickness exceeds the above range, scaling-down of the memory cell is hindered. In addition, there is a risk of hindering development of ferroelectricity at the time of crystallization annealing.

A ferroelectric contained in the first ferroelectric region 31, the second ferroelectric region 32, and the third ferroelectric region 33 is preferably hafnium oxide from the viewpoint of consistency with the semiconductor process. The hafnium oxide preferably contains at least one element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). As the above element is contained, ferroelectricity is easily exhibited in hafnium oxide.

The ferroelectric contained in the first ferroelectric region 31, the second ferroelectric region 32, and the third ferroelectric region 33 is, for example, hafnium oxide mainly having orthorhombic. More specifically, the hafnium oxide is hafnium oxide mainly having orthorhombic III with space group $Pbc2_1$ and space group number 29. An arbitrary amount of zirconium oxide may be mixed into the hafnium oxide, but a crystal structure of the hafnium oxide needs to be mainly the above-described orthorhombic III.

As described above, it is possible to realize the multi-value ferroelectric memory according to the first embodiment.

Second Embodiment

A semiconductor memory device of a second embodiment includes a semiconductor layer; a gate electrode including a first portion, a second portion provided to be spaced apart from the first portion in a direction along a surface of the semiconductor layer, and a spacer provided between the first portion and the second portion; and a first insulating layer provided between the semiconductor layer and the gate electrode, the first insulating layer including a first region containing at least one of a ferroelectric, a ferrielectric, or an anti-ferroelectric, a second region containing at least one of a ferroelectric, a ferrielectric, or an anti-ferroelectric, and a boundary region provided between the first region and the second region, wherein the first region is positioned between the first portion and the semiconductor layer, the second region is positioned between the second portion and the semiconductor layer, the boundary region is positioned between the spacer and the semiconductor layer, and the boundary region has a chemical composition different from that of the spacer. The second embodiment is different from the first embodiment in terms that the gate electrode includes the first portion, the second portion provided to be spaced apart from the first portion in the direction along the surface of the semiconductor layer, and the spacer provided between the first portion and the second portion. Hereinafter, some of the content overlapping with that in the first embodiment will not be described.

Figure 4:
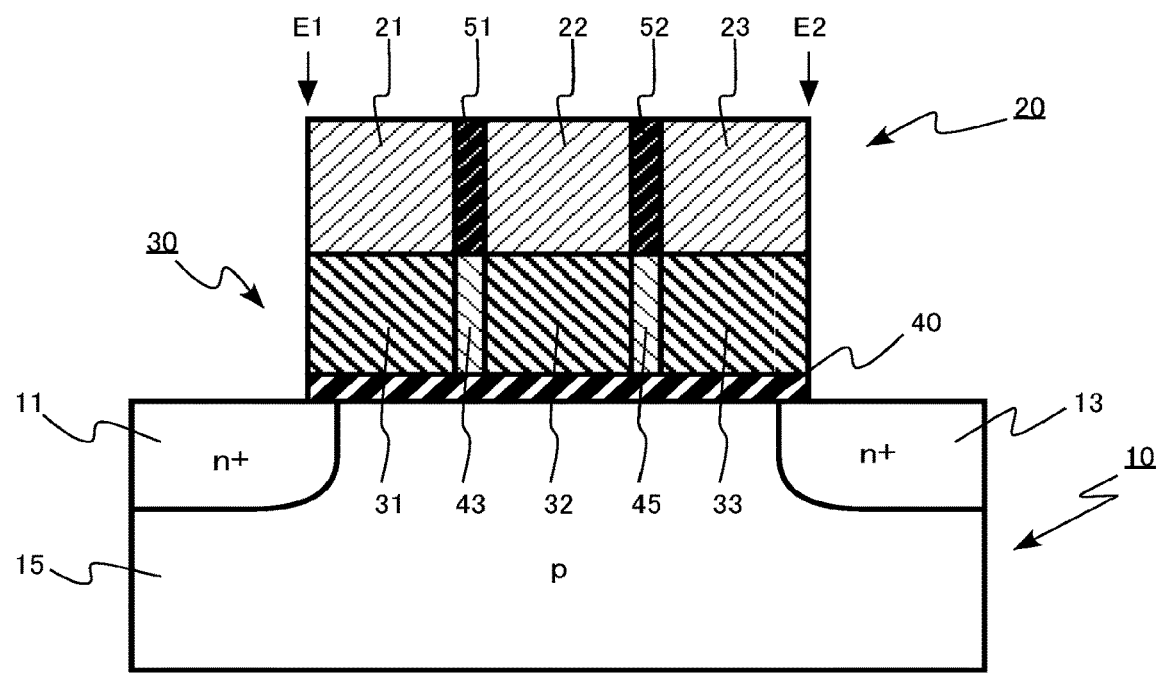
FIG. 4 is a schematic cross-sectional view of a semiconductor memory device according to a second embodiment.

FIG. 4 is a schematic cross-sectional view of the semiconductor memory device according to the second embodiment. The semiconductor memory device of the second embodiment is a memory cell having an MFS structure.

The memory cell of the second embodiment includes a semiconductor layer 10, a source region 11, a drain region 13, a channel region 15, a gate electrode 20, a gate insulating layer 30 (a first insulating layer), and an interface insulating layer 40 (a second insulating layer). The gate electrode 20 includes a first gate region 21 (the first portion), a second gate region 22 (the second portion), a third gate region 23, a first spacer 51 (the spacer), and a second spacer 52. The gate insulating layer 30 includes a first ferroelectric region 31 (the first region), a second ferroelectric region 32 (the second region), a third ferroelectric region 33, a first paraelectric region 43 (the boundary region), and a second paraelectric region 45.

The gate electrode 20 is metal or a semiconductor. The gate electrode 20 is, for example, polycrystalline silicon containing n-type impurities or p-type impurities.

The gate electrode 20 has a first end (E1 in FIG. 4) and a second end (E2 in FIG. 4) on a side of the semiconductor layer 10.

The gate electrode 20 has the first gate region 21, the second gate region 22, the third gate region 23, the first spacer 51, and the second spacer 52. The first spacer 51 is provided between the first gate region 21 and the second gate region 22, and the second spacer 52 is provided between the second gate region 22 and the third gate region 23.

The first gate region 21, the second gate region 22, and the third gate region 23 are spaced apart from each other in the direction along the surface of the semiconductor layer 10.

The first gate region 21 is on a side of the first end E1, and the second gate region 22 is on a side of the second end E2 with respect to the first gate region 21.

The first spacer 51 and the second spacer 52 are, for example, insulators. These insulators can be leaky insulator, and the leakier insulator is favorable for these cases. The first spacer 51 and the second spacer 52 are, for example, electric conductors, which have different crystal structures or different composition against the first gate resion 21 and the second gate region 22 and the third gate region 23. The first spacer 51 and the second spacer 52 are, for example, oxides or oxynitrides. The first spacer 51 and the second spacer 52 are, for example, material containing 50% or more of ruthenium oxide, strontium ruthenate, rhenium oxide, titanium oxide, titanium oxynitride, tantalum oxide, cerium oxide, praseodymium oxide, neodymium oxide, europium oxide, thulium oxide, scandium oxide, molybdenum oxide, niobium oxide, silicon nitride, silicon nitride, silicon oxynitride, aluminum nitride, aluminum oxide, aluminum oxynitride, or silicon oxide.

The first gate region 21, the second gate region 22, and the third gate region 23 are electrically connected. The first gate region 21, the second gate region 22, and the third gate region 23 are set to a common potential by, for example, a contact electrode (not illustrated). The first gate region 21, the second gate region 22, and the third gate region 23 are configured, for example, such that a tunnel current, a leakage current, a hopping current, or the like flows through the first spacer 51 and the second spacer 52 so that a voltage drop and operation delay caused by the first spacer 51 and the second spacer 52 are negligible.

The first gate region 21 is an example of the first portion. The second gate region 22 is an example of the second portion. The first spacer 51 is an example of the spacer.

The gate insulating layer 30 includes the first ferroelectric region 31 (the first region), the second ferroelectric region 32 (the second region), the third ferroelectric region 33, the first paraelectric region 43, and the second paraelectric region 45.

The first ferroelectric region 31 is positioned between the first gate region 21 and the semiconductor layer 10. The second ferroelectric region 32 is positioned between the second gate region 22 and the semiconductor layer 10. The third ferroelectric region 33 is positioned between the third gate region 23 and the semiconductor layer 10.

Each of the first ferroelectric region 31, the second ferroelectric region 32, and the third ferroelectric region 33 contains at least one of the ferroelectric, the ferrielectric, or the anti-ferroelectric. Each of the first ferroelectric region 31, the second ferroelectric region 32, and the third ferroelectric region 33 contains, for example, hafnium oxide, lead zirconate titanate (PZT), strontium bismuth tantalate (SBT), barium titanate (BTO), or polyvinylidene fluoride (PVDF).

For example, the first ferroelectric region 31, the second ferroelectric region 32, and the third ferroelectric region 33 can have the same coercive electric field, for example. In addition, the first ferroelectric region 31, the second ferroelectric region 32, and the third ferroelectric region 33 may have the same crystal orientation, for example.

The first ferroelectric region 31 is an example of the first region. In addition, the second ferroelectric region 32 is an example of the second region.

The first paraelectric region 43 is positioned between the first spacer 51 and the semiconductor layer 10. The second ferroelectric region 32 is positioned between the second spacer 52 and the semiconductor layer 10.

The first paraelectric region 43 and the second paraelectric region 45 have different chemical compositions from those of the first spacer 51 and the second spacer 52. The first paraelectric region 43 and the second paraelectric region 45 are, for example, paraelectrics.

The main metal component of the first paraelectric region 43 and the second paraelectric region 45 is the same as the main metal component of the first ferroelectric region 31, the second ferroelectric region 32, and the third ferroelectric region 33. The main metal component means a metal element having the highest proportion in the corresponding material. The first paraelectric region 43 and the second paraelectric region 45 are, for example, the paraelectrics having the same chemical composition as the first ferroelectric region 31, the second ferroelectric region 32, and the third ferroelectric region 33. The first paraelectric region 43 and the second paraelectric region 45, for example, have a crystal structure different from that of the first ferroelectric region 31, the second ferroelectric region 32, and the third ferroelectric region 33. In the case that the main component of the first ferroelectric region 31, the second ferroelectric region 32, and the third ferroelectric region 33 are polymers or monomers, the main component of the first paraelectric region 43 and the second paraelectric region 45 can be polymers or monomers. The main unit of these polymers or monomers of the ferroelectric regions can be the same polymers or monomers as the paraelectric regions, though one reagion appears ferroelectricity and the other region does not appear ferroelectricity but paraelectricity by the difference of the accessory units or components. The main component means an element or a chemical compound having the highest proportion in the corresponding material.

Each film thicknesses of the first paraelectric region 43 and the second paraelectric region 45 is, for example, 0.1 nm or more and 2.5 nm or less.

The first paraelectric region 43 is an example of the boundary region.

As the gate electrode 20 is provided with the first spacer 51 and the second spacer 52, portions of the gate insulating layer 30 in contact with the first spacer 51 and the second spacer 52, that is, the portions corresponding to the first paraelectric region 43 and the second paraelectric region 45 become the paraelectrics instead of being ferroelectrics at the time of crystallization annealing.

The first ferroelectric region 31 is provided on the side of the first end (E1 in FIG. 4) of the gate electrode 20 with respect to the first paraelectric region 43, and the second ferroelectric region 32 is provided on the side of the second end (E2 in FIG. 4) of the gate electrode 20 with respect to the first paraelectric region 43.

The first ferroelectric region 31 and the second ferroelectric region 32 are divided laterally by the first paraelectric region 43. The second ferroelectric region 32 and the third ferroelectric region 33 are divided laterally by the second paraelectric region 45.

The interface insulating layer 40 is provided between the semiconductor layer 10 and the gate insulating layer 30. The interface insulating layer 40 is, for example, a material containing 50% or more of silicon nitride, aluminum nitride, aluminum oxide, or silicon oxide.

The interface insulating layer 40 suppresses the first paraelectric region 43 and the second paraelectric region 45 from exhibiting ferroelectricity at the time of crystallization annealing. The interface insulating layer 40 is an example of the second insulating layer.

According to the memory cell of the second embodiment, the ferroelectric region is divided, and thus, it is possible to accurately write polarization values corresponding to desired multiple values. Therefore, it is possible to realize a multi-value ferroelectric memory.

In the case of the memory cell of the second embodiment, it is possible to store four values since the ferroelectric region is divided into three regions.

As described above, it is possible to realize the multi-value ferroelectric memory according to the second embodiment.

Third Embodiment

A semiconductor memory device of a third embodiment is different from that of the first embodiment in terms that a boundary member is provided in a gate insulating layer. Hereinafter, some of the content overlapping with that in the first or second embodiment will not be described.

Figure 5:
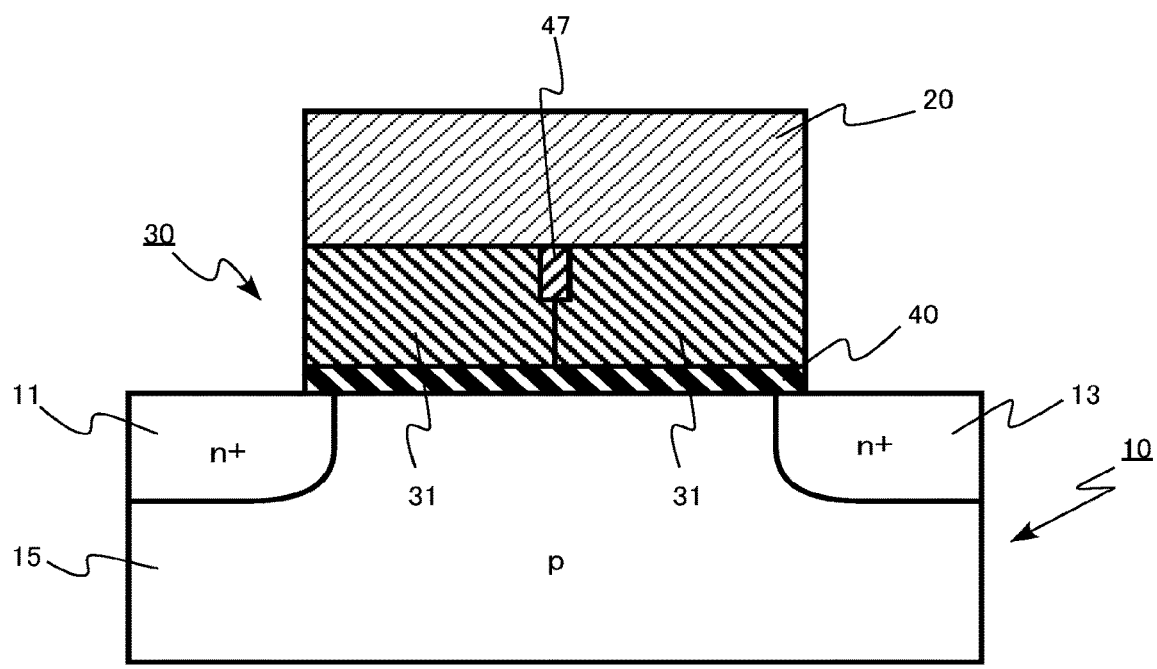
FIG. 5 is a schematic cross-sectional view of a semiconductor memory device according to a third embodiment.

FIG. 5 is a schematic cross-sectional view of the semiconductor memory device according to the third embodiment. The semiconductor memory device of the third embodiment is a memory cell having an MFS structure.

The memory cell of the third embodiment includes a semiconductor layer 10, a source region 11, a drain region 13, a channel region 15, a gate electrode 20, a gate insulating layer 30 (a first insulating layer), and an interface insulating layer 40 (a second insulating layer). The gate insulating layer 30 has a first ferroelectric region 31 (a first region), a second ferroelectric region (a second region), and a boundary member 47.

The boundary member 47 is, for example, metal, a semiconductor, or an insulator. The boundary member 47 is provided between the first ferroelectric region 31 and the second ferroelectric region 32. The boundary member 47 is an example of the boundary region.

The interface insulating layer 40 is provided between the semiconductor layer 10 and the gate insulating layer 30. The interface insulating layer 40 is, for example, a material containing 50% or more of silicon nitride, aluminum nitride, aluminum oxide, or silicon oxide.

The interface insulating layer 40 suppresses short circuit with respect to the semiconductor layer 10 particularly when the boundary member 47 is metal. The interface insulating layer 40 is an example of the second insulating layer.

In the memory cell of the third embodiment, the first ferroelectric region 31 and the second ferroelectric region 32 are not completely separated. However, since the boundary member 47 is provided as a singular point, a delay occurs in movement of the domain wall in the vicinity of the boundary member 47. Therefore, it is possible to accurately write polarization values corresponding to desired multiple values. Accordingly, it is possible to realize a multi-value ferroelectric memory.

In the case of the memory cell of the third embodiment, it is possible to store three values since the ferroelectric region is divided into two regions.

As described above, it is possible to realize the multi-value ferroelectric memory according to the third embodiment.

Fourth Embodiment

A semiconductor memory device of a fourth embodiment includes a stacked body in which an interlayer insulating layer and a conductive layer are alternately stacked in a first direction; a semiconductor layer provided in the stacked body and extending in a first direction; a first insulating layer provided between the conductive layer and the semiconductor layer and containing at least one of a ferroelectric, a ferrielectric, or an anti-ferroelectric; a second insulating layer provided between the first insulating layer and the semiconductor layer and having a chemical composition different from that of the first insulating layer; and a third insulating layer provided between the second insulating layer and the semiconductor layer and containing at least one of a ferroelectric, a ferrielectric, or an anti-ferroelectric. The semiconductor memory device of the fourth embodiment is different from that of the first embodiment in terms that a structure similar to that of the memory cell of the first embodiment is applied to a three-dimensional NAND flash memory. Hereinafter, some of the content overlapping with that in the first embodiment will not be described.

Figure 6:
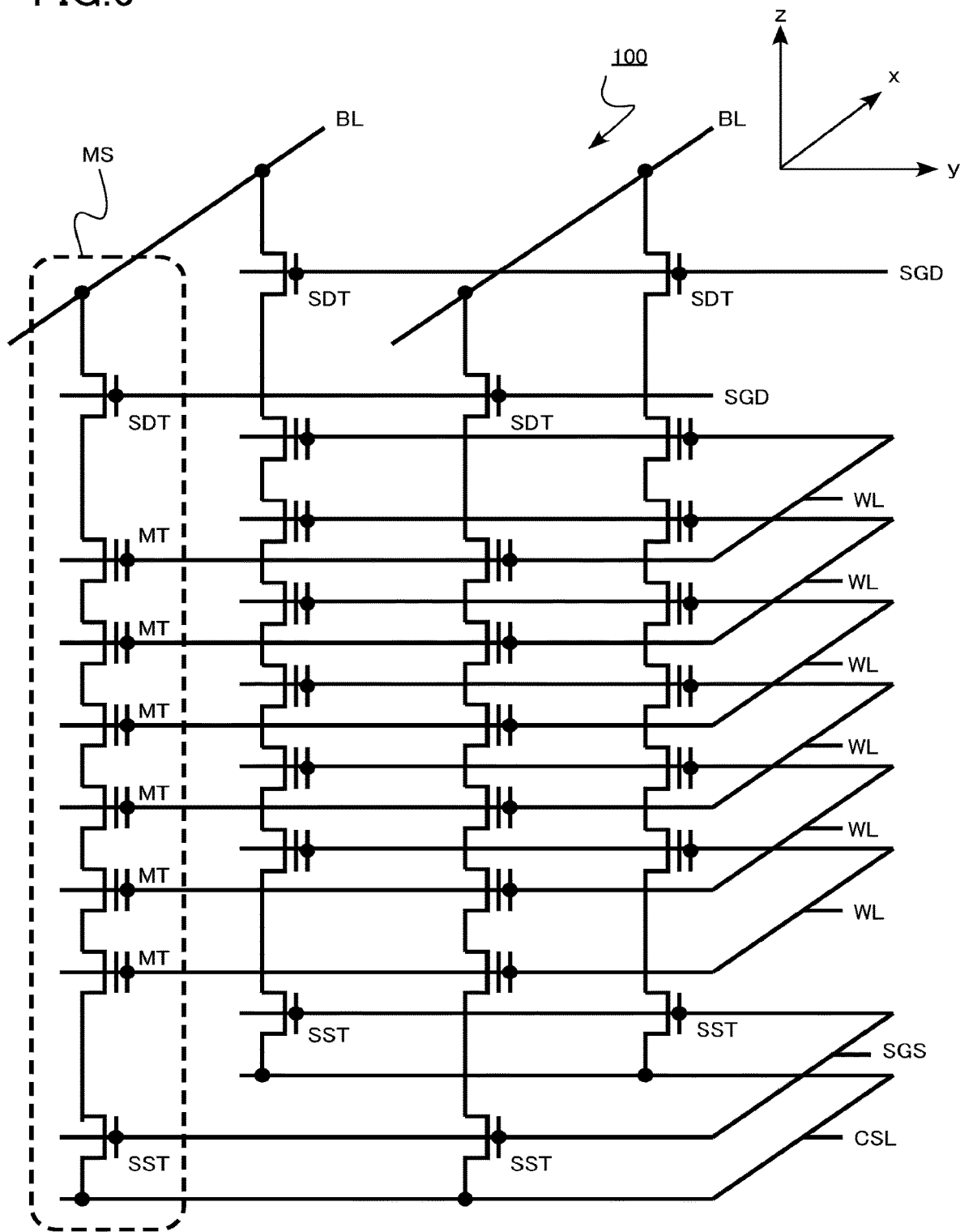
FIG. 6 is a circuit diagram of a memory cell array of a semiconductor memory device according to a fourth embodiment.
Figure 7:
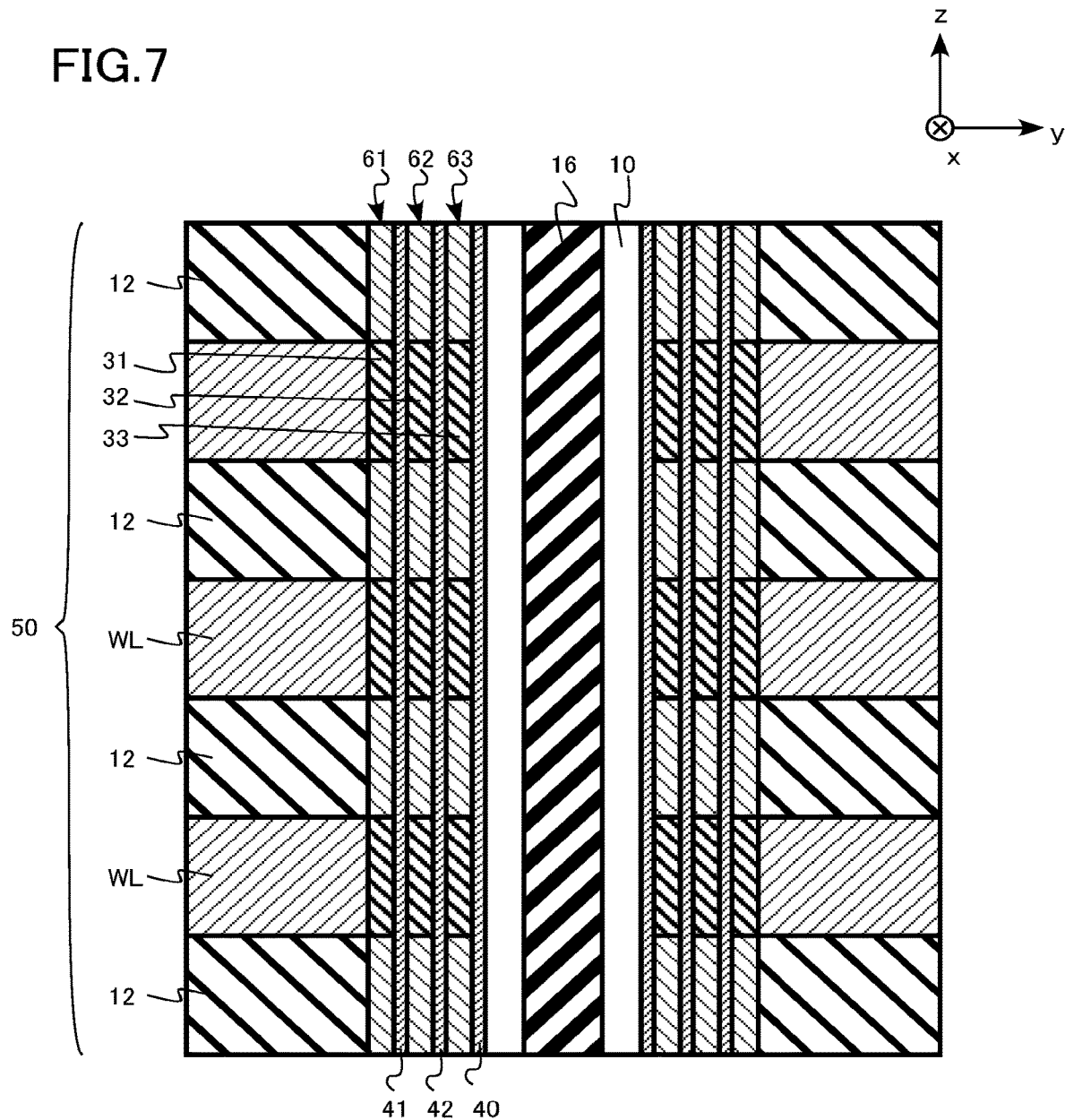
FIG. 7 is a schematic cross-sectional view of a part of a memory string of the semiconductor memory device according to the fourth embodiment.

FIG. 6 is a circuit diagram of a memory cell array 100 of the semiconductor memory device of the fourth embodiment. FIG. 7 is a schematic cross-sectional view of a part of a memory string MS of the semiconductor memory device of the fourth embodiment. FIG. 7 illustrates a cross section of a plurality of memory cell transistors MT in the single memory string MS surrounded by, for example, a dotted line in the memory cell array 100 of FIG. 6.

As illustrated in FIG. 6, the memory cell array 100 of the three-dimensional NAND flash memory of the fourth embodiment includes a plurality of word lines WL, a common source line CSL, a source selection gate line SGS, a plurality of drain selection gate lines SGD, a plurality of bit lines BL, and a plurality of the memory strings MS.

As illustrated in FIG. 6, the memory string MS is configured to include a source selection transistor SST, the plurality of memory cell transistors MT, and a drain selection transistor SDT which are connected in series between the common source line CSL and the bit line BL. The single memory string MS is selected by the bit line BL and the drain selection gate line SGD, and the single memory cell transistor MT can be selected by the word line WL.

As illustrated in FIG. 7, the memory cell array 100 includes a plurality of word lines WL (conductive layers), a semiconductor layer 10, a plurality of interlayer insulating layers 12, a core insulating layer 16, a first ferroelectric region 31 (a first region), a second ferroelectric region 32 (a second region), a third ferroelectric region 33, an interface insulating layer 40 (a fourth insulating layer), a first boundary insulating layer 41 (a second insulating layer), a second boundary insulating layer 42, a first ferroelectric layer 61 (a first insulating layer), a second ferroelectric layer 62 (a third insulating layer), and a third ferroelectric layer 63. The plurality of word lines WL and the plurality of interlayer insulating layers 12 form a stacked body 50.

The word line WL and the interlayer insulating layer 12 are provided on a semiconductor substrate (not illustrated).

The word line WL and the interlayer insulating layer 12 are alternately stacked in a z direction (first direction) on the semiconductor substrate. The plurality of word lines WL and the plurality of interlayer insulating layers 12 form the stacked body 50.

The word line WL is a plate-shaped conductor. The word line WL is, for example, metal or a semiconductor. The word line WL is, for example, tungsten (W). The word line WL functions as a control electrode of the memory cell transistor MT. The word line WL is a gate electrode layer.

The interlayer insulating layer 12 separates the word line WL and the word line WL. The interlayer insulating layer 12 is, for example, silicon oxide.

The word line WL is an example of the conductive layer.

The core insulating layer 16 is provided in the stacked body 50. The core insulating layer 16 extends in the z direction. The core insulating layer 16 is provided to penetrate through the stacked body 50. The core insulating layer 16 is surrounded by the semiconductor layer 10. The core insulating layer 16 is, for example, silicon oxide. The core insulating layer 16 is an example of an insulating member.

The semiconductor layer 10 is provided in the stacked body 50. The semiconductor layer 10 extends in the z direction. The semiconductor layer 10 is provided to penetrate through the stacked body 50. The semiconductor layer 10 is provided around the core insulating layer 16. The semiconductor layer 10 has, for example, a cylindrical shape.

The semiconductor layer 10 is, for example, polycrystalline silicon, polycrystalline silicon germanium, polycrystalline indium gallium zinc oxide, or polycrystalline zinc oxide tin. The semiconductor layer 10 functions as a channel of the memory cell transistor MT.

The first ferroelectric layer 61 is provided between the word line WL and the semiconductor layer 10. The second ferroelectric layer 62 is provided between the first ferroelectric layer 61 and the semiconductor layer 10. The third ferroelectric layer 63 is provided between the second ferroelectric layer 62 and the semiconductor layer 10.

Each of the first ferroelectric layer 61, the second ferroelectric layer 62, and the third ferroelectric layer 63 contains at least one of a ferroelectric, a ferrielectric, or an antiferroelectric. Each of the first ferroelectric layer 61, the second ferroelectric layer 62, and the third ferroelectric layer 63 contains, for example, hafnium oxide, lead zirconate titanate (PZT), strontium bismuth tantalate (SBT), barium titanate (BTO), or polyvinylidene fluoride (PVDF).

The first ferroelectric layer 61 is an example of the first insulating layer. The second ferroelectric layer 62 is an example of the third insulating layer.

The first ferroelectric region 31, the second ferroelectric region 32, and the third ferroelectric region 33 are a part of the first ferroelectric layer 61, the second ferroelectric layer 62, and the third ferroelectric layer 63, respectively. The first ferroelectric region 31, the second ferroelectric region 32, and the third ferroelectric region 33 are provided in a region between the word line WL and the semiconductor layer 10.

Each of the first ferroelectric region 31, the second ferroelectric region 32, and the third ferroelectric region 33 contains at least one of the ferroelectric, the ferrielectric, or the anti-ferroelectric. Each of the first ferroelectric region 31, the second ferroelectric region 32, and the third ferroelectric region 33 contains, for example, hafnium oxide, lead zirconate titanate (PZT), strontium bismuth tantalate (SBT), barium titanate (BTO), or polyvinylidene fluoride (PVDF).

For example, the first ferroelectric region 31, the second ferroelectric region 32, and the third ferroelectric region 33 can have the same coercive electric field, for example. In addition, the first ferroelectric region 31, the second ferroelectric region 32, and the third ferroelectric region 33 may have the same crystal orientation, for example.

The first ferroelectric region 31 is an example of the first region. The second ferroelectric region 32 is an example of the second region.

The first boundary insulating layer 41 is provided between the first ferroelectric layer 61 and the second ferroelectric layer 62. The second boundary insulating layer 42 is provided between the second ferroelectric layer 62 and the third ferroelectric layer 63.

For example, each of the first boundary insulating layer 41 and the second boundary insulating layer 42 has a chemical composition different from that of the first ferroelectric region 31, the second ferroelectric region 32, and the third ferroelectric region 33. Each of the first boundary insulating layer 41 and the second boundary insulating layer 42 is, for example, a paraelectric body. Each of the first boundary insulating layer 41 and the second boundary insulating layer 42 is, for example, silicon nitride, aluminum nitride, aluminum oxide, or silicon oxide.

Each film thicknesses of the first boundary insulating layer 41 and the second boundary insulating layer 42 is, for example, 0.1 nm or more and 2.5 nm or less.

The first boundary insulating layer 41 is an example of the second insulating layer.

The interface insulating layer 40 is provided between the semiconductor layer 10 and the gate insulating layer 30. The interface insulating layer 40 is, for example, a material containing 50% or more of silicon nitride, aluminum nitride, aluminum oxide, or silicon oxide.

The interface insulating layer 40 suppresses a part of the third ferroelectric layer 63 between the interlayer insulating layer 12 and the semiconductor layer 10 from exhibiting ferroelectricity at the time of crystallization annealing. The interface insulating layer 40 is an example of the fourth insulating layer.

Next, an example of a method of manufacturing the semiconductor memory device according to the fourth embodiment will be described.

First, the interlayer insulating layer 12 and the word line WL are alternately deposited on a semiconductor substrate. The interlayer insulating layer 12 and the word line WL are formed by, for example, a chemical vapor deposition (CVD) method. The interlayer insulating layer 12 is, for example, silicon oxide. The word line WL is, for example, polycrystalline silicon containing conductive impurities.

Next, an opening that penetrates through the interlayer insulating layer 12 and the word line WL is formed. The opening is formed by using, for example, a lithography method and a reactive ion etching (RIE) method.

Next, the first ferroelectric layer 61, the first boundary insulating layer 41, the second ferroelectric layer 62, the second boundary insulating layer 42, and the third ferroelectric layer 63 are stacked in the opening. The first ferroelectric layer 61, the first boundary insulating layer 41, the second ferroelectric layer 62, the second boundary insulating layer 42, and the third ferroelectric layer 63 are formed by, for example, a CVD method. The first ferroelectric layer 61, the second ferroelectric layer 62, and the third ferroelectric layer 63 are, for example, amorphous hafnium oxide. The first boundary insulating layer 41 and the second boundary insulating layer 42 are, for example, silicon nitride.

Next, the interface insulating layer 40 and the semiconductor layer 10 are formed in the opening. Further, the core insulating layer 16 is buried in the opening. The core insulating layer 16 is buried, for example, by a CVD method. The core insulating layer 16 is, for example, silicon oxide.

Next, crystallization annealing is performed. The first ferroelectric layer 61, the second ferroelectric layer 62, and the third ferroelectric layer 63 are crystallized by the crystallization annealing to form the first ferroelectric region 31, the second ferroelectric region 32, and the third ferroelectric region 33. The crystallization annealing is performed at a temperature of 600° C. to 1000° C., for example.

During the crystallization annealing, each region of the first ferroelectric layer 61, the second ferroelectric layer 62, and the third ferroelectric layer 63 sandwiched between the word line WL and the semiconductor layer 10 becomes the ferroelectric. These regions become the first ferroelectric region 31, the second ferroelectric region 32, and the third ferroelectric region 33, respectively.

The first ferroelectric region 31, the second ferroelectric region 32, and the third ferroelectric region 33 are divided by the first boundary insulating layer 41 and the second boundary insulating layer 42. Accordingly, the divided ferroelectric regions are formed.

The semiconductor memory device of the fourth embodiment illustrated in FIG. 7 is manufactured according to the above manufacturing method.

The first ferroelectric region 31 and the second ferroelectric region 32 are divided laterally by the first boundary insulating layer 41. Similarly, the second ferroelectric region 32 and the third ferroelectric region 33 are divided laterally by the second boundary insulating layer 42.

The first ferroelectric region 31, the second ferroelectric region 32, the third ferroelectric region 33, the interface insulating layer 40, the first boundary insulating layer 41, and the second boundary insulating layer 42 function as gate insulating layers of the memory cell transistor MT. The memory cell transistor MT stores multi-value data using a polarization reversal state of the gate insulating layer.

Each gate insulating layer of the memory cell transistors MT includes three divided ferroelectric regions. Therefore, four values can be stored.

As described above, it is possible to realize a multi-value ferroelectric memory according to the fourth embodiment, which is similar to the first embodiment. In addition, the memory capacity can be further increased by forming the three-dimensional structure.

Fifth Embodiment

A semiconductor memory device of a fifth embodiment includes a stacked body in which an interlayer insulating layer and a conductive layer are alternately stacked in a first direction; a semiconductor layer provided in the stacked body and extending in the first direction; and a first insulating layer provided between the conductive layer and the semiconductor layer and containing at least one of a ferroelectric, a ferrielectric, or an anti-ferroelectric, in which the conductive layer includes a first conductive film, a second conductive film electrically connected to the first conductive film, and a spacer film provided between the first conductive film and the second conductive film. The semiconductor memory device of the fifth embodiment is different from that of the second embodiment in terms that a structure similar to that of the memory cell of the second embodiment is applied to a three-dimensional NAND flash memory. Hereinafter, some of the content overlapping with that in the second embodiment will not be described. In addition, some of the content regarding the three-dimensional NAND flash memory that overlaps with that in the fourth embodiment will not be described.

Figure 8:
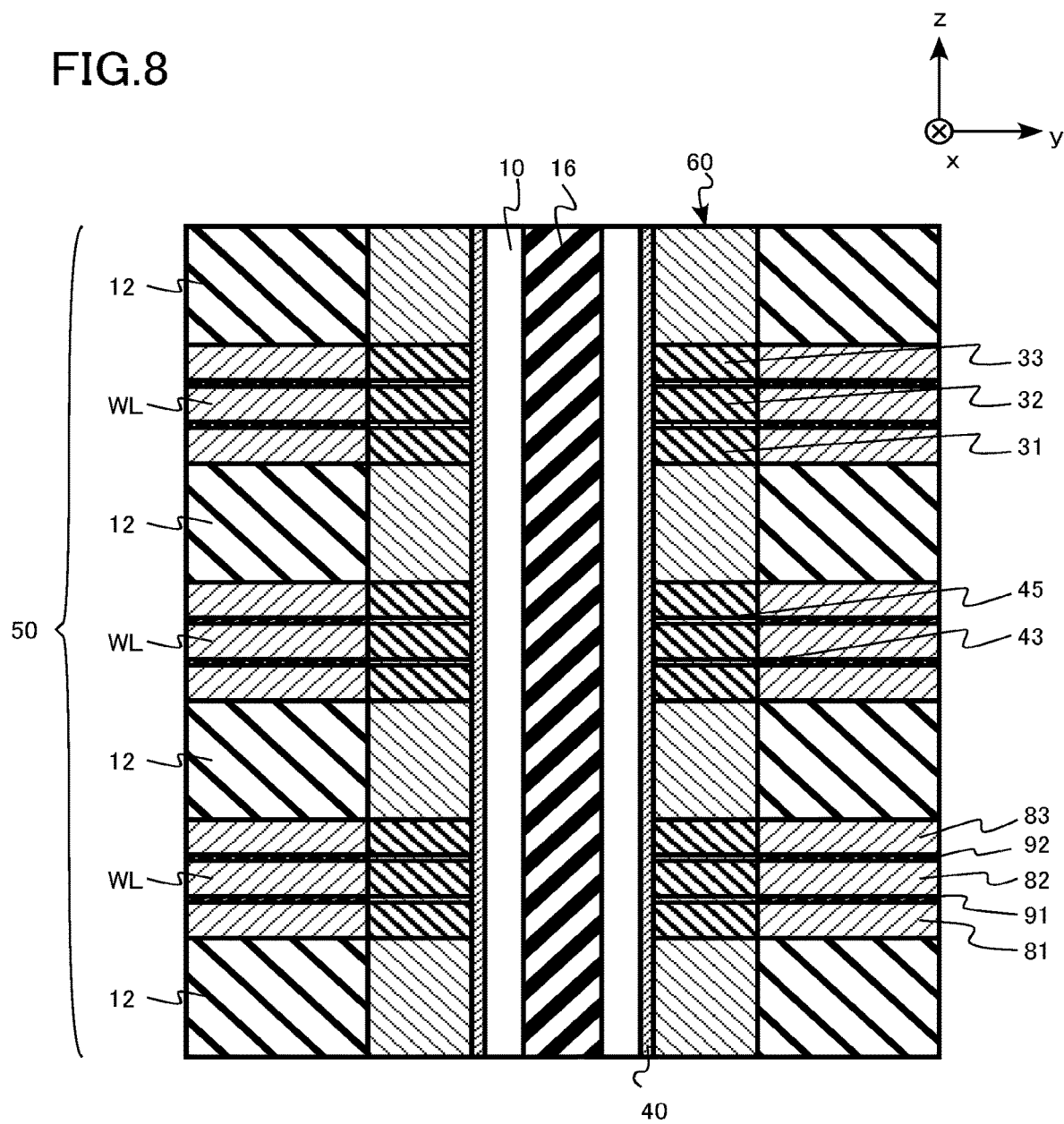
FIG. 8 is a schematic cross-sectional view of a part of a memory string of a semiconductor memory device according to a fifth embodiment.

FIG. 8 is a schematic cross-sectional view of a part of a memory string MS of the semiconductor memory device of the fifth embodiment. FIG. 8 illustrates a cross section of a plurality of memory cell transistors MT in the memory string MS.

As illustrated in FIG. 8, the semiconductor memory device of the fifth embodiment includes a plurality of word lines WL (the conductive layers), a semiconductor layer 10, a plurality of interlayer insulating layers 12, a core insulating layer 16, a first ferroelectric region 31 (a first region), a second ferroelectric region 32 (a second region), a third ferroelectric region 33, a first paraelectric region 43 (a boundary region), a second paraelectric region 45, an interface insulating layer 40 (a second insulating layer), and a ferroelectric layer 60 (a first insulating layer). The plurality of word lines WL and the plurality of interlayer insulating layers 12 form the stacked body 50.

The word line WL and the interlayer insulating layer 12 are provided on a semiconductor substrate (not illustrated).

The word line WL and the interlayer insulating layer 12 are alternately stacked in a z direction (first direction) on the semiconductor substrate. The plurality of word lines WL and the plurality of interlayer insulating layers 12 form the stacked body 50.

The word line WL is a plate-shaped conductor. The word line WL is, for example, metal or a semiconductor. The word line WL is, for example, tungsten (W). The word line WL functions as a control electrode of the memory cell transistor MT. The word line WL is a gate electrode layer.

The word line WL includes a first conductive film 81, a second conductive film 82, a third conductive film 83, a first spacer film 91 (spacer film), and a second spacer film 92. The first spacer film 91 is an example of a spacer film.

The first conductive film 81, the second conductive film 82, and the third conductive film 83 are electrically connected to each other.

The first spacer film 91 and the second spacer film 92 are, for example, insulators. These insulators can be leaky insulator, and the leakier insulator is favorable for these cases. The first spacer 91 and the second spacer 92 are, for example, electric conductors, which have different crystal structures or different composition against the first conductive film 81 and the second conductive film 82 and the third conductive film 83. The first spacer film 91 and the second spacer film 92 are, for example, oxides, oxynitrides, or the like. The first spacer film 91 and the second spacer film 92 are, for example, material containing 50% or more of ruthenium oxide, strontium ruthenate, rhenium oxide, titanium oxide, titanium oxynitride, tantalum oxide, cerium oxide, praseodymium oxide, neodymium oxide, europium oxide, thulium oxide, scandium oxide, molybdenum oxide, niobium oxide, silicon nitride, silicon oxynitride, aluminum nitride, aluminum oxide, aluminum oxynitride, or silicon oxide.

The interlayer insulating layer 12 separates the word line WL and the word line WL. The interlayer insulating layer 12 is, for example, silicon oxide.

The word line WL is an example of the conductive layer.

The core insulating layer 16 is provided in the stacked body 50. The core insulating layer 16 extends in the z direction. The core insulating layer 16 is provided to penetrate through the stacked body 50. The core insulating layer 16 is surrounded by the semiconductor layer 10. The core insulating layer 16 is, for example, silicon oxide. The core insulating layer 16 is an example of an insulating member.

The semiconductor layer 10 is provided in the stacked body 50. The semiconductor layer 10 extends in the z direction. The semiconductor layer 10 is provided to penetrate through the stacked body 50. The semiconductor layer 10 is provided around the core insulating layer 16. The semiconductor layer 10 has, for example, a cylindrical shape.

The semiconductor layer 10 is, for example, polycrystalline silicon. The semiconductor layer 10 functions as a channel of the memory cell transistor MT.

The ferroelectric layer 60 is provided between the word line WL and the semiconductor layer 10.

The ferroelectric layer 60 contains at least one of a ferroelectric, a ferrielectric, or an anti-ferroelectric. The ferroelectric layer 60 contains, for example, hafnium oxide, lead zirconate titanate (PZT), strontium bismuth tantalate (SBT), barium titanate (BTO), or polyvinylidene fluoride (PVDF).

Each of the first ferroelectric region 31, the second ferroelectric region 32, and the third ferroelectric region 33 is a part of the ferroelectric layer 60. The first ferroelectric region 31, the second ferroelectric region 32, and the third ferroelectric region 33 are provided in a region between the word line WL and the semiconductor layer 10.

The first ferroelectric region 31 is provided between the first conductive film 81 and the semiconductor layer 10. The second ferroelectric region 32 is provided between the second conductive film 82 and the semiconductor layer 10. The third ferroelectric region 33 is provided between the third conductive film 83 and the semiconductor layer 10.

Each of the first ferroelectric region 31, the second ferroelectric region 32, and the third ferroelectric region 33 contains at least one of the ferroelectric, the ferrielectric, or the anti-ferroelectric. Each of the first ferroelectric region 31, the second ferroelectric region 32, and the third ferroelectric region 33 contains, for example, hafnium oxide, lead zirconate titanate (PZT), strontium bismuth tantalate (SBT), barium titanate (BTO), or polyvinylidene fluoride (PVDF).

For example, the first ferroelectric region 31, the second ferroelectric region 32, and the third ferroelectric region 33 can have the same coercive electric field, for example. In addition, the first ferroelectric region 31, the second ferroelectric region 32, and the third ferroelectric region 33 may have the same crystal orientation, for example.

The first ferroelectric region 31 is an example of the first region. The second ferroelectric region 32 is an example of the second region.

The first paraelectric region 43 is provided between the first ferroelectric region 31 and the second ferroelectric region 32. The second paraelectric region 45 is provided between the second ferroelectric region 32 and the third ferroelectric region 33.

The first paraelectric region 43 is provided between the first spacer film 91 and the semiconductor layer 10. The second paraelectric region 45 is provided between the second spacer film 92 and the semiconductor layer 10.

The first paraelectric region 43 and the second paraelectric region 45 have different chemical compositions from those of the first spacer film 91 and the second spacer film 92, for example. The first paraelectric region 43 and the second paraelectric region 45 are, for example, paraelectrics.

The main metal component of the first paraelectric region 43 and the second paraelectric region 45 is the same as, for example, the main metal component of the first ferroelectric region 31, the second ferroelectric region 32, and the third ferroelectric region 33. The main metal component means a metal element having the highest proportion in the corresponding material. The first paraelectric region 43 and the second paraelectric region 45 are, for example, the paraelectrics having the same chemical composition as the first ferroelectric region 31, the second ferroelectric region 32, and the third ferroelectric region 33. The first paraelectric region 43 and the second paraelectric region 45, for example, have a crystal structure different from that of the first ferroelectric region 31, the second ferroelectric region 32, and the third ferroelectric region 33. In the case that the main component of the first ferroelectric region 31, the second ferroelectric region 32, and the third ferroelectric region 33 are polymers or monomers, the main component of the first paraelectric region 43 and the second paraelectric region 45 can be polymers or monomers. The main unit of these polymers or monomers of the ferroelectric regions can be the same polymers or monomers as the paraelectric regions, though one reagion appears ferroelectricity and the other region does not appear ferroelectricity but paraelectricity by the difference of the accessory units or components.

The first paraelectric region 43 is an example of the boundary region.

The interface insulating layer 40 is provided between the semiconductor layer 10 and the ferroelectric layer 60. The interface insulating layer 40 is, for example, silicon nitride, aluminum nitride, aluminum oxide, or silicon oxide.

The interface insulating layer 40 suppresses the ferroelectric layer 60 from exhibiting ferroelectricity at the time of crystallization annealing. The interface insulating layer 40 is an example of the second insulating layer.

Next, an example of a method of manufacturing the semiconductor memory device according to the fifth embodiment will be described.

FIGS. 9, 10, 11, and 12 are schematic cross-sectional views illustrating the example of the method of manufacturing the semiconductor memory device of the fifth embodiment.

Figure 9:
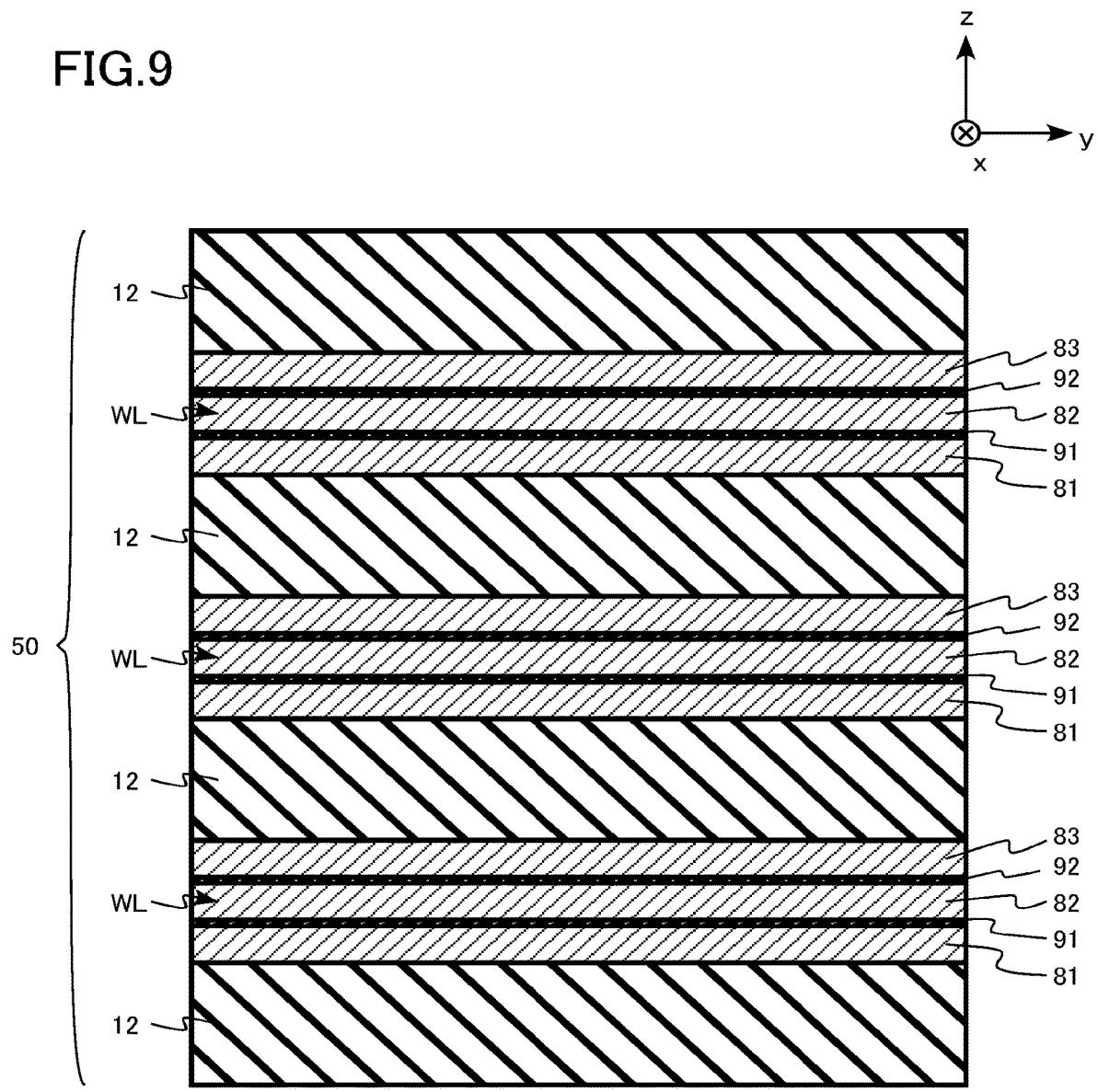
FIG. 9 is a schematic cross-sectional view illustrating an example of a method of manufacturing the semiconductor memory device according to the fifth embodiment.

First, the interlayer insulating layer 12 and the word line WL are alternately deposited on a semiconductor substrate (not illustrated) (FIG. 9). Each of the word lines WL is formed by stacking the first conductive film 81, the first spacer film 91, the second conductive film 82, the second spacer film 92, and the third conductive film 83 in this order. The interlayer insulating layer 12 and the word line WL are formed by, for example, a chemical vapor deposition (CVD) method. The interlayer insulating layer 12 is, for example, silicon oxide. The first conductive film 81, the second conductive film 82, and the third conductive film 83 are, for example, polycrystalline silicon containing conductive impurities. The first spacer film 91 and the second spacer film 92 are, for example, silicon nitride.

Figure 10:
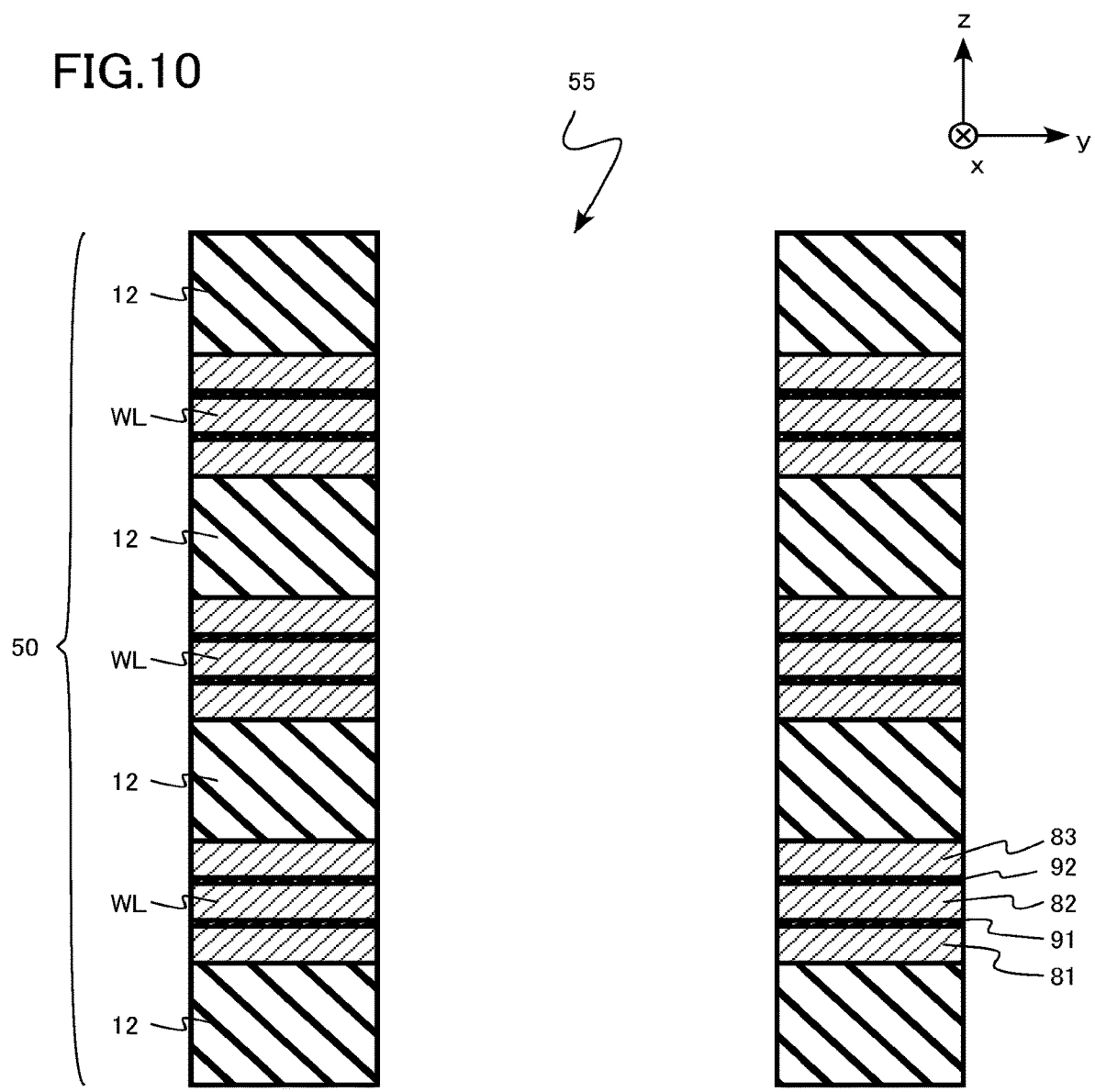
FIG. 10 is a schematic cross-sectional view illustrating an example of the method of manufacturing the semiconductor memory device of the fifth embodiment.

Next, an opening 55 that penetrates through the interlayer insulating layer 12 and the word line WL is formed (FIG. 10). The opening 55 is formed by, for example, a lithography method and a reactive ion etching (RIE) method.

Figure 11:
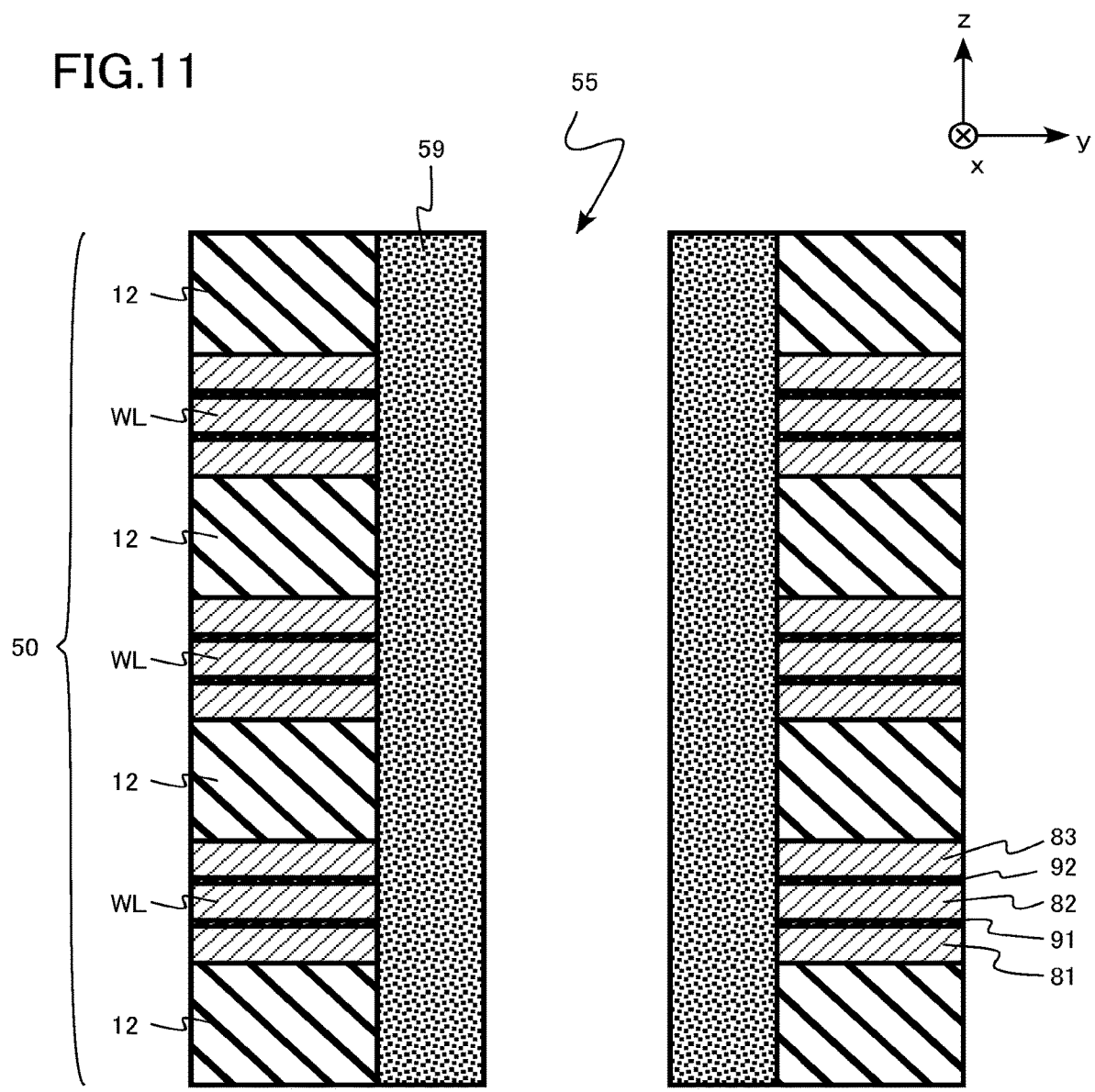
FIG. 11 is a schematic cross-sectional view illustrating an example of the method of manufacturing the semiconductor memory device of the fifth embodiment.

Next, an oxide layer 59 is formed in the opening 55 (FIG. 11). The oxide layer 59 is formed by, for example, a CVD method. The oxide layer 59 is, for example, amorphous hafnium oxide.

Figure 12:
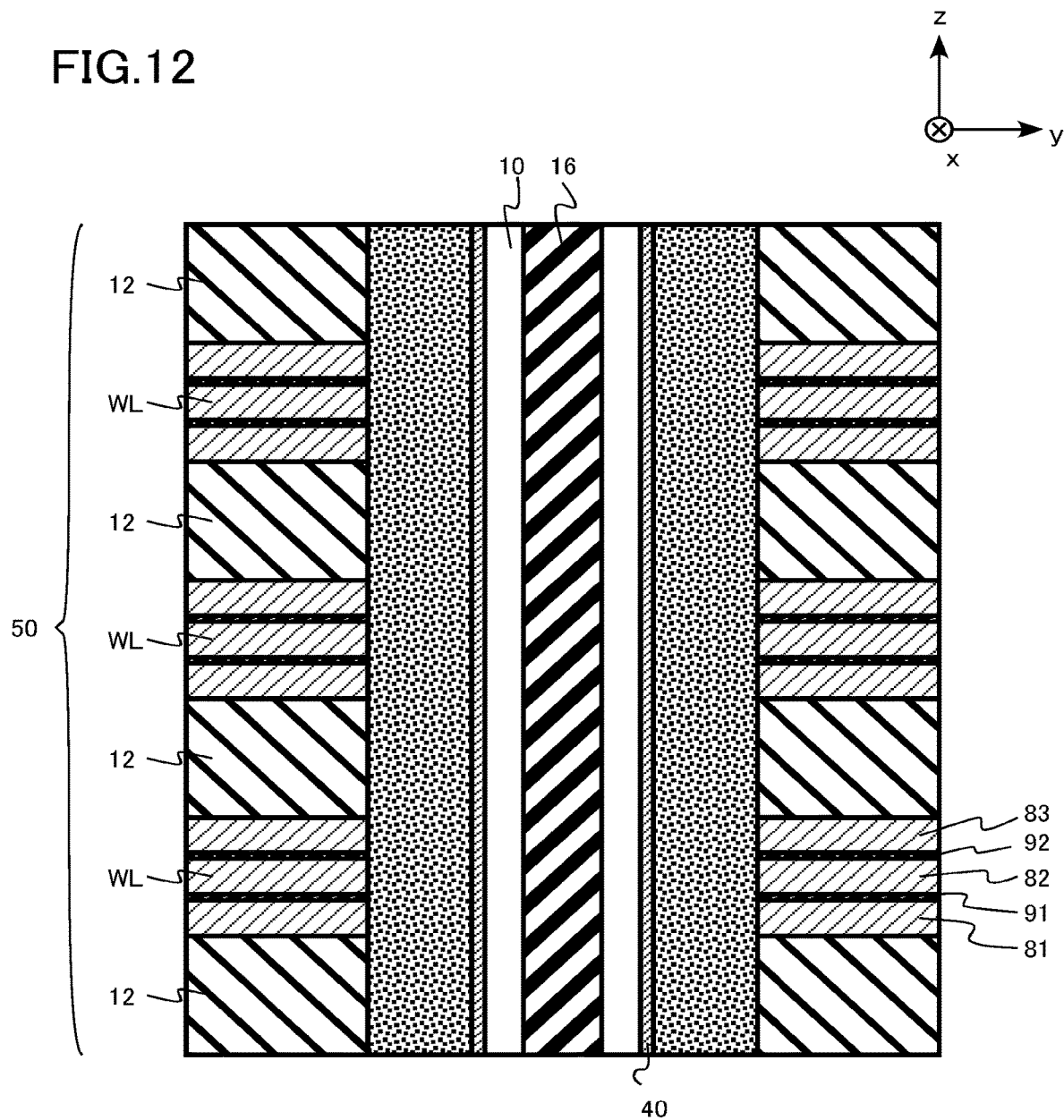
FIG. 12 is a schematic cross-sectional view illustrating an example of the method of manufacturing the semiconductor memory device of the fifth embodiment.

Next, the interface insulating layer 40 and the semiconductor layer 10 are formed in the opening 55. Further, the core insulating layer 16 is buried in the opening 55 (FIG. 12). The core insulating layer 16 is buried, for example, by a CVD method. The core insulating layer 16 is, for example, silicon oxide.

Next, crystallization annealing is performed. The oxide layer 59 is crystallized by the crystallization annealing to form the first ferroelectric region 31, the second ferroelectric region 32, the third ferroelectric region 33, the first paraelectric region 43, and the second paraelectric region 45. The crystallization annealing is performed at a temperature of 600° C. to 1000° C., for example.

During the crystallization annealing, portions of the ferroelectric layer 60 that are in contact with the first spacer film 91 and the second spacer film 92 become paraelectrics instead of being ferroelectrics. Therefore, the first paraelectric region 43 and the second paraelectric region 45 are formed in such portions. Accordingly, the divided ferroelectric regions are formed.

The semiconductor memory device of the fifth embodiment illustrated in FIG. 8 is manufactured according to the above manufacturing method.

The first ferroelectric region 31 and the second ferroelectric region 32 are divided vertically by the first paraelectric region 43. Similarly, the second ferroelectric region 32 and the third ferroelectric region 33 are divided vertically by the second paraelectric region 45.

Each gate insulating layer of the memory cell transistors MT includes three divided ferroelectric regions. Therefore, four values can be stored.

The first ferroelectric region 31, the second ferroelectric region 32, the third ferroelectric region 33, and the interface insulating layer 40 function as gate insulating layers of the memory cell transistor MT. The memory cell transistor MT stores multi-value data using a polarization reversal state of the gate insulating layer.

As described above, it is possible to realize a multi-value ferroelectric memory according to the fifth embodiment, which is similar to the second embodiment. In addition, the memory capacity can be further increased by forming the three-dimensional structure.

Sixth Embodiment

A semiconductor memory device of a sixth embodiment is an aspect obtained by combining the fourth embodiment and the fifth embodiment. Hereinafter, some of the content overlapping with that in the fourth embodiment and the fifth embodiment will not be described.

Figure 13:
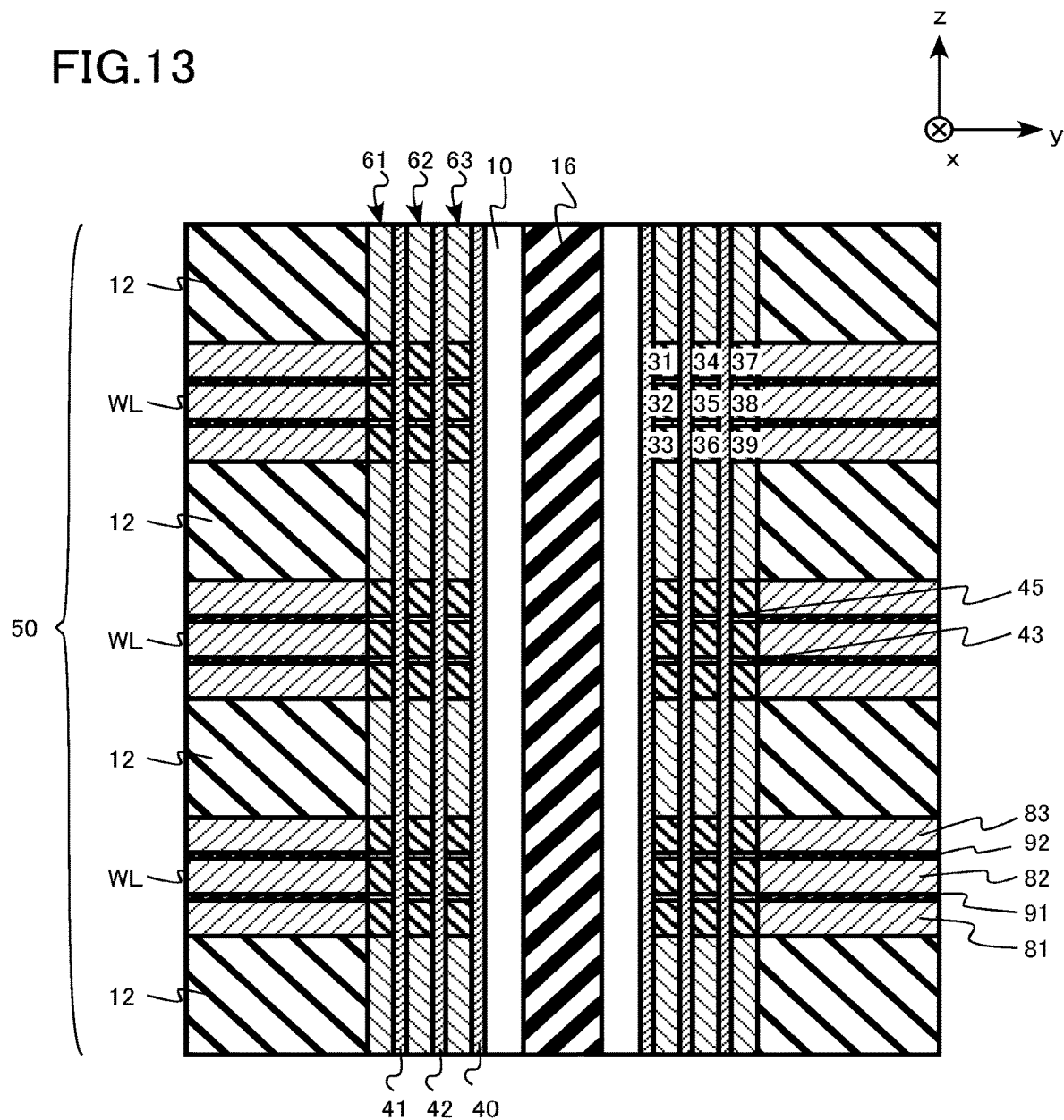
FIG. 13 is a schematic cross-sectional view of a part of a memory string MS of a semiconductor memory device according to a sixth embodiment.

FIG. 13 is a schematic cross-sectional view of a part of a memory string MS of the semiconductor memory device of the sixth embodiment. FIG. 13 illustrates a cross section of a plurality of memory cell transistors MT in the memory string MS.

As illustrated in FIG. 13, the semiconductor memory device of the sixth embodiment includes a plurality of word lines WL (conductive layers), a semiconductor layer 10, a plurality of interlayer insulating layers 12, a core insulating layer 16, a first ferroelectric region 31, a second ferroelectric region 32, a third ferroelectric region 33, a fourth ferroelectric region 34, a fifth ferroelectric region 35, a sixth ferroelectric region 36, a seventh ferroelectric region 37, an eighth ferroelectric region 38, a ninth ferroelectric region 39, an interface insulating layer 40 (a fourth insulating layer), a first boundary insulating layer 41 (a second insulating layer), a second boundary insulating layer 42, a first ferroelectric layer 61 (a first insulating layer), a second ferroelectric layer 62 (a third insulating layer), a third ferroelectric layer 63, a first paraelectric region 43, and a second paraelectric region 45. The plurality of word lines WL and the plurality of interlayer insulating layers 12 form the stacked body 50. The word line WL includes a first conductive film 81, a second conductive film 82, a third conductive film 83, a first spacer film 91, and a second spacer film 92.

Hereinafter, an example of a method of manufacturing the semiconductor memory device according to the sixth embodiment will be described.

First, the interlayer insulating layer 12 and the word line WL are alternately deposited on a semiconductor substrate. Each of the word lines WL is formed by stacking the first conductive film 81, the first spacer film 91, the second conductive film 82, the second spacer film 92, and the third conductive film 83 in this order. The interlayer insulating layer 12 and the word line WL are formed by, for example, a CVD method. The interlayer insulating layer 12 is, for example, silicon oxide. The first conductive film 81, the second conductive film 82, and the third conductive film 83 are, for example, polycrystalline silicon containing conductive impurities. The first spacer film 91 and the second spacer film 92 are, for example, silicon nitride.

Next, an opening that penetrates through the interlayer insulating layer 12 and the word line WL is formed. An opening 55 is formed by, for example, a lithography method and a RIE method.

Next, the first ferroelectric layer 61, the first boundary insulating layer 41, the second ferroelectric layer 62, the second boundary insulating layer 42, and the third ferroelectric layer 63 are stacked in the opening. The first ferroelectric layer 61, the first boundary insulating layer 41, the second ferroelectric layer 62, the second boundary insulating layer 42, and the third ferroelectric layer 63 are formed by, for example, a CVD method. The first ferroelectric layer 61, the second ferroelectric layer 62, and the third ferroelectric layer 63 are, for example, amorphous hafnium oxide. The first boundary insulating layer 41 and the second boundary insulating layer 42 are, for example, silicon nitride.

Next, the interface insulating layer 40 and the semiconductor layer 10 are formed in the opening. Further, the core insulating layer 16 is buried in the opening. The core insulating layer 16 is buried, for example, by a CVD method. The core insulating layer 16 is, for example, silicon oxide.

Next, crystallization annealing is performed. The first ferroelectric layer 61, the second ferroelectric layer 62, and the third ferroelectric layer 63 are crystallized by the crystallization annealing. The crystallization annealing is performed at a temperature of 600° C. to 1000° C., for example.

During the crystallization annealing, each region of the first ferroelectric layer 61, the second ferroelectric layer 62, and the third ferroelectric layer 63 sandwiched between the word line WL and the semiconductor layer 10 becomes the ferroelectric. In addition, portions of the first ferroelectric layer 61, the second ferroelectric layer 62, and the third ferroelectric layer 63 that are in contact with the first spacer film 91 and the second spacer film 92 become paraelectrics instead of being ferroelectrics. Therefore, the first paraelectric region 43 and the second paraelectric region 45 are formed in such portions. Accordingly, the divided ferroelectric regions are formed.

The semiconductor memory device of the sixth embodiment illustrated in FIG. 13 is manufactured according to the above manufacturing method.

According to the semiconductor memory device of the sixth embodiment, one memory cell transistor includes nine divided ferroelectric regions. Accordingly, ten values can be stored.

As described above, it is possible to realize the multi-value ferroelectric memory according to the sixth embodiment. In addition, it is possible to further increase the memory capacity by forming a three-dimensional structure and increasing the number of divided ferroelectric regions.

Seventh Embodiment

A semiconductor memory device of a seventh embodiment is different from that of the fourth embodiment in terms that each shape of a first ferroelectric region, a second ferroelectric region, and a third ferroelectric region in a plane perpendicular to a first direction is specified as a polygon. Hereinafter, some of the content overlapping with that in the fourth embodiment will not be described.

Figure 14:
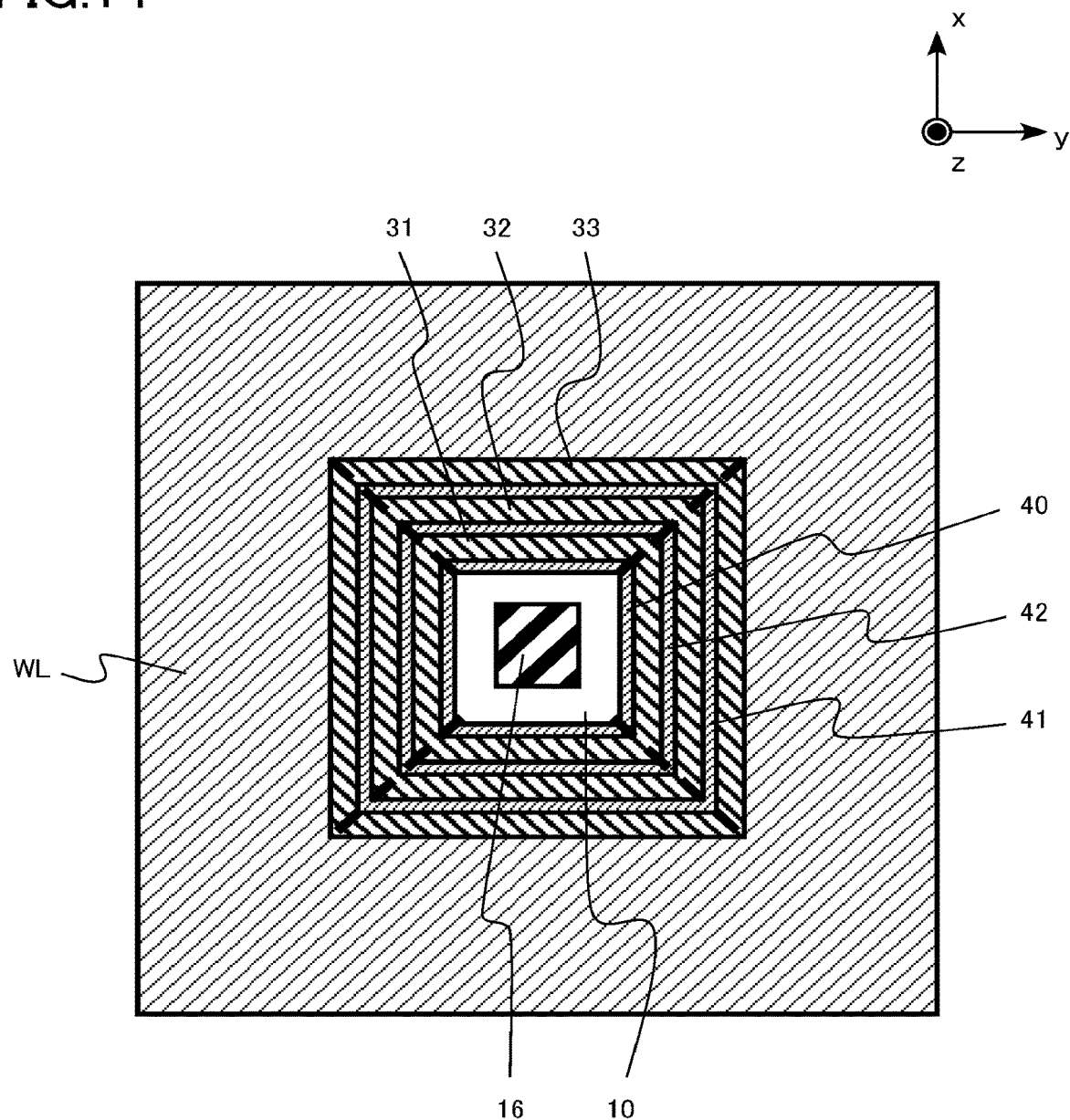
FIG. 14 is a schematic cross-sectional view of a semiconductor memory device according to a seventh embodiment.

FIG. 14 is a schematic cross-sectional view of the semiconductor memory device according to the seventh embodiment. FIG. 14 is the cross-sectional view corresponding to a cross-sectional view along the plane perpendicular to the z direction (first direction), that is, an xy plane of FIG. 7 of the fourth embodiment. FIG. 14 is the cross-sectional view that passes through a word line WL.

Each outer shape of the first ferroelectric region 31, the second ferroelectric region 32, and the third ferroelectric region 33 is a quadrangular. Since each outer shape of the first ferroelectric region 31, the second ferroelectric region 32, and the third ferroelectric region 33 is the quadrangular, corners of the quadrangle become singular points, and a boundary illustrated by a dotted line in FIG. 14 is a stable boundary of polarization grains. Therefore, one memory cell transistor MT includes twelve stable ferroelectric regions. Accordingly, thirteen values can be stored.

Incidentally, each outer shape of the first ferroelectric region 31, the second ferroelectric region 32, and the third ferroelectric region 33 is not limited to the quadrangle as long as the shape is a polygon. For example, the outer shape may be a pentagon, a hexagon, an octagon, or the like. In addition, the corner of the polygon is not necessarily sharp, and preferably has a radius smaller than own radius of a memory hole. Further, a side of the polygon is not necessarily a straight line, and may be a curved line. The side of the polygon may be bulged to the extent that does not become a circle, or conversely, may be depressed.

As described above, it is possible to realize the multivalue ferroelectric memory according to the seventh embodiment. In addition, it is possible to further increase the memory capacity by forming a three-dimensional structure and increasing the number of stable ferroelectric regions of the single memory cell transistor MT.

Eighth Embodiment

A semiconductor memory device of an eighth embodiment is different from that of the fourth embodiment in terms that a semiconductor layer 10 is divided into four regions. Hereinafter, some of the content overlapping with that in the fourth embodiment will not be described.

Figure 15:
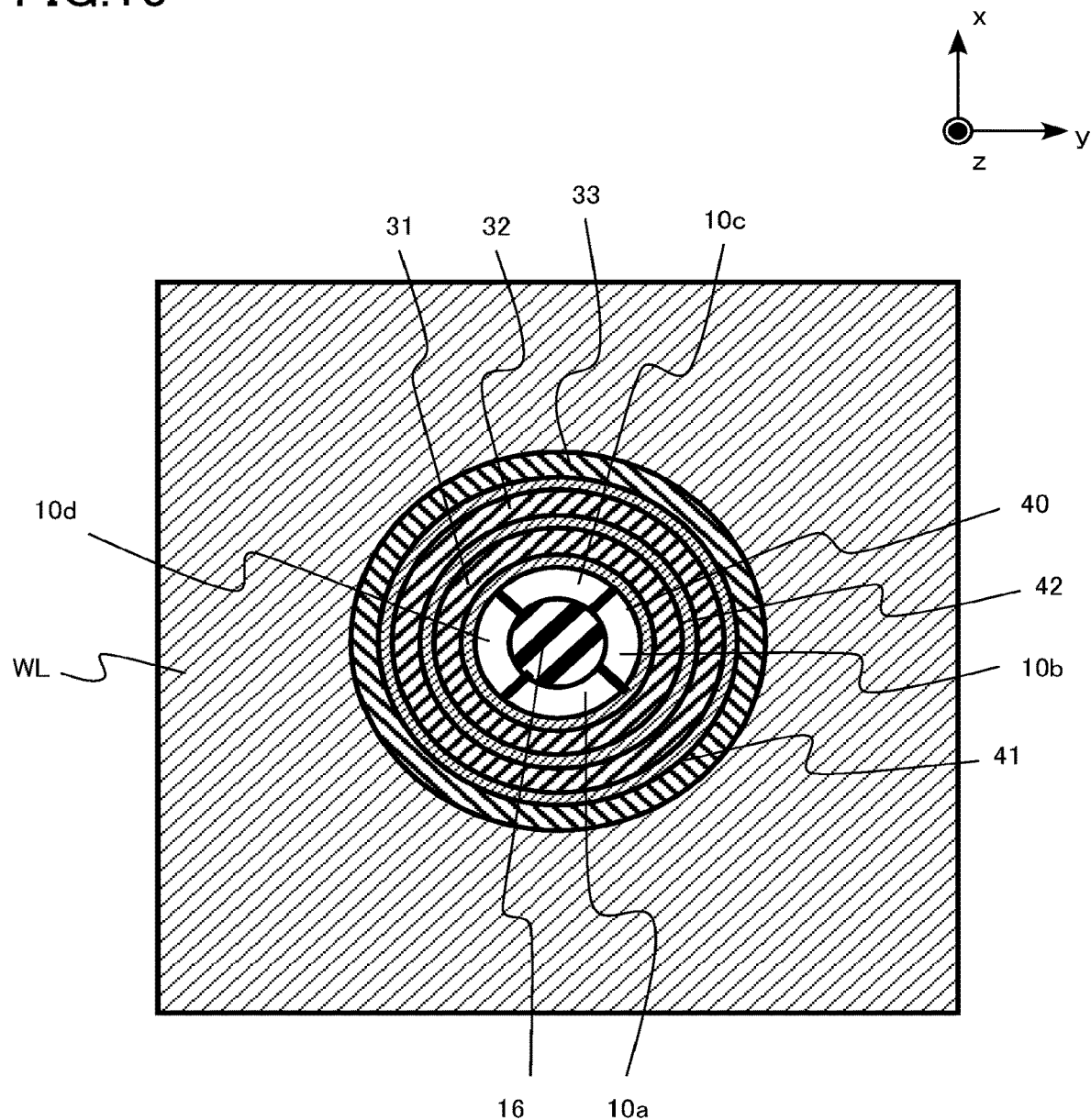
FIG. 15 is a schematic cross-sectional view of a semiconductor memory device according to an eighth embodiment.

FIG. 15 is a schematic cross-sectional view of the semiconductor memory device according to the eighth embodiment. FIG. 15 is the cross-sectional view corresponding to a cross-sectional view along the plane perpendicular to a z direction (first direction), that is, an xy plane of FIG. 7 of the fourth embodiment. FIG. 15 is the cross-sectional view that passes through a word line WL.

The semiconductor layer 10 around one core insulating layer 16 is divided into four regions 10a, 10b, 10c, and 10d. Accordingly, four memory strings MS divided around the single core insulating layer 16 are formed.

As described above, it is possible to realize the multivalue ferroelectric memory according to the eighth embodiment. In addition, it is possible to further increase the memory capacity by forming a three-dimensional structure and the divided memory strings MS.

As described above, the case where the ferroelectric is mainly applied has been described as an example in the first to eighth embodiments, but, it is possible to obtain the same or similar function and effect even if a ferrielectric or an anti-ferroelectric is applied instead of the ferroelectric.

In addition, for example, the coercive electric field of each layer may be formed to be substantially the same for each divided ferroelectric region in the first to eighth embodiments. In this case, it is possible to form the coercive electric fields of the respective layers to be almost the same by adjusting a spontaneous polarization amount, a squareness ratio, a film thickness, a volume, a shape, a composition, a crystal structure, a crystal structure ratio, a crystal orientation, a grain size, an interface structure, an interface area, or the like. For example, when the ferroelectric region of the present application is formed on an inner wall of a cylindrical memory hole, it is easier to adjust a spontaneous polarization amount, a squareness ratio, a film thickness, a volume, a shape, a composition, a crystal structure, a crystal structure ratio, a crystal orientation, a grain size, an interface structure, an interface area, or the like in order to form the coercive electric fields of the respective layers to be almost the same.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a semiconductor layer;
    a gate electrode including a first portion, a second portion provided to be spaced apart from the first portion in a direction along a surface of the semiconductor layer, and a spacer provided between the first portion and the second portion; and
    a first insulating layer provided between the semiconductor layer and the gate electrode, the first insulating layer including a first region containing at least one of a ferroelectric, a ferrielectric, or an anti-ferroelectric, a second region containing at least one of a ferroelectric, a ferrielectric, or an anti-ferroelectric, and a boundary region provided between the first region and the second region,
    wherein the first region is positioned between the first portion and the semiconductor layer,
    the second region is positioned between the second portion and the semiconductor layer,
    the boundary region is positioned between the spacer and the semiconductor layer, and
    the boundary region has a chemical composition different from a chemical composition of the spacer.
2. The semiconductor memory device according to claim 1, wherein
    the first portion and the second portion are electrically connected.

3. The semiconductor memory device according to claim 1, wherein
the boundary region is a paraelectric.

4. The semiconductor memory device according to claim 1, wherein
a metal element which is a main metal component of the boundary region is identical to a metal element which is a main metal component of the first region and of the second region.

5. The semiconductor memory device according to claim 4, wherein
the boundary region has a chemical composition identical to a chemical composition of the first region and a chemical composition of the second region.

6. The semiconductor memory device according to claim 1, further comprising
a second insulating layer provided between the semiconductor layer and the first insulating layer, the second insulating layer having a chemical composition different from a chemical composition of the first insulating layer.

7. The semiconductor memory device according to claim 1, wherein
the first insulating layer contains hafnium oxide.

* * * * *